United States Patent
Hill

(10) Patent No.: US 6,608,483 B1
(45) Date of Patent: Aug. 19, 2003

(54) QUADRATURE DIFFERENTIAL CHARGE COMMUTATION SENSOR ENABLING WIDE BANDWITH FIELD MILLS AND OTHER ELECTROSTATIC FIELD MEASURING DEVICES

(76) Inventor: John P. Hill, P.O. Box 494, Nederland, CO (US) 80466

( * ) Notice: Subject to any disclaimer, the term of this patent is extended or adjusted under 35 U.S.C. 154(b) by 16 days.

(21) Appl. No.: 09/992,089

(22) Filed: Nov. 13, 2001

(51) Int. Cl.[7] .............................................. G01R 29/12
(52) U.S. Cl. ..................................... 324/458; 324/457
(58) Field of Search ........................... 324/72, 458, 109, 324/457

(56) References Cited

U.S. PATENT DOCUMENTS

| | | | |
|---|---|---|---|
| 3,812,419 A | 5/1974 | Kauzinger et al. ............. 324/32 |
| 3,846,700 A | 11/1974 | Sasaki et al. .................. 324/72 |
| 4,055,798 A | 10/1977 | Kato .............................. 324/32 |
| 4,222,007 A | * 9/1980 | Comstock .................... 324/458 |
| 4,370,616 A | 1/1983 | Williams ..................... 324/458 |
| 4,424,481 A | 1/1984 | Laroche et al. ................ 324/72 |
| 4,642,559 A | 2/1987 | Slough .......................... 324/72 |
| 5,315,232 A | * 5/1994 | Stewart ......................... 324/72 |
| 6,492,911 B1 | * 12/2002 | Netzer ................... 340/870.37 |

OTHER PUBLICATIONS

Chalmers, J. Alan, "Atmospheric Electricity", 1957, Permagon Press/The Macmillan Company, pp. 211–234.
Kessler, Edwin, Instruments and Techniques for Thunderstorm Observation and Analysis, 2nd Edition, vol. 3 of "Thunderstorms: A Social, Scientific, and Technological Documentary", 1983, University of Oklahoma Press, pp. 83–118.
Chang, Jen–Shih et al., "Handbook of Electrostatic Processes", 1995, Marcel Dekker, Inc., pp. 225–246.
Rust, David W., "Utilization of a Mobile Laboratory for Storm Electricity Measurements", Journal of Geophysical Research, vol. 94, No. D11, Sep. 30, 1989, pp. 13305–13311.

* cited by examiner

Primary Examiner—N. Le
Assistant Examiner—John Teresinski
(74) Attorney, Agent, or Firm—William E. Hein

(57) ABSTRACT

An electrostatic field sensor configuration and supporting signal processing electronics provides a wider bandwidth than prior art sensors, thus enabling the present sensor to replace three prior art instruments in the application of measuring atmospheric electricity. The quadrature, differential characteristics of the present sensor also provide suppression of unwanted disturbances and more accurate electrostatic field measurements. Besides application in the geophysical instrument known as a field mill, the present sensor may be employed in any system for measuring quasi-static and rapidly changing electrostatic fields.

14 Claims, 18 Drawing Sheets

Shutter

Sensor

Shutter

Sensor

QUADRATURE DIFFERENTIAL CHARGE COMMUTATION SENSOR ENABLING WIDE BANDWITH FIELD MILLS AND OTHER ELECTROSTATIC FIELD MEASURING DEVICES

BACKGROUND AND SUMMARY OF THE INVENTION

The present invention relates generally to Electrostatic Field measuring devices and, more particularly, to sensor configurations and signal processing methods that provide enhancements in the bandwidth and suppression of unwanted signals or noise.

There is a long history of people studying atmospheric electricity. Storm prediction and analysis of electric fields and discharges (lightning) associated with storm clouds have necessitated the creation of several types of geophysical sensors and instruments. The field mill is a geophysical sensor that is designed to measure the electric fields below and near storm clouds.

Chalmers, J. Alan, *Atmospheric Electricity*, 1957, New York Pergamon Press, pp. 212–217 provides a description of the distribution of charges in clouds and the resulting field observed at the ground level. The most common storm cloud has a positive charge distribution in the top of the cloud and a negative charge distribution in the bottom of the cloud. This is called a positive cloud and is most common in the regions studied, although other charge distributions do exist in clouds. Monitoring the electric field at ground level as a positive storm cloud approaches would show a positive field if the cloud is at some distance and a negative field as the cloud passes overhead. As the cloud recedes, a positive field would again be observed. This can be predicted by considering the geometry of the cloud charge distribution in relation to the observation point. In clear weather, the typical field at ground level has been measured to be about 100 to 300 volts/meter, whereas the field associated with storm clouds is typically in the thousands of volts/meter. These field measurements are considered to be quasi-static since they are either constant or vary at a low rate of change. In order to measure these quasi-static fields, the field mill was developed. Field levels associated with lightning exhibit a rate of change that is higher than can be tracked by the typical field mill.

Chalmers, supra, also cited a study in England by Wormell involving the use of an inverted test plate connected to an electrometer. The test plate was shielded from above to protect it from rain. As the test plate was covered and uncovered, the electrometer registered the field due to the cloud charge in the region. This prior art study could be considered a manual version of the field mill developed later. Wormell stated that he could only measure the quasi-static or stable fields before the lightning flashes, not the rapidly varying values that occurred after the flashes. This limitation was due to the limited bandwidth of the instrument.

Kessler, *Instruments and Techniques for Thunderstorm Observation and Analysis*, vol. 3, 1983, Normand: University of Oklahoma Press, pp. 89–102, in the chapter authored by Edward T. Pierce, it is stated that although many designs for field mills exist, all operate on the same basic principles. The principles Pierce describes come from basic electrostatic theory and can be summarized as follows. If a conducting plate having a surface area A is exposed to an electrostatic field of magnitude E in a medium such as a vacuum or air (free space) that has a permittivity e0, a surface charge of e0*E*A will be generated on the surface of the plate. If the conducting plate is shielded, this surface charge will be effectively zero. Thus, if the conducting plate is repetitively exposed to and shielded from the electrostatic field, the resulting charge waveform will be an alternating one. This charge waveform can be further processed to extract the magnitude of the field E.

The typical field mill cited in the Kessler reference consists of a set of conducting plates, insulated and alternately shielded from and exposed to the electrostatic field by a rotor having open areas and solid areas. This structure produces an exposed plate area that varies as a triangular function of time and in this example has a frequency of 100 Hz. After this triangular signal is demodulated by a signal that is synchronized with the rotor, the triangular signal is integrated over a time constant that often exceeds 0.1 second. This integration (low pass filtering), along with the variation in exposed plate area over time rendered this prior art field mill unsuitable for studying electrostatic fields that change rapidly, such as those related to lightning discharges. The need for additional instrumentation in such measurement applications is recognized by the prior artisan Pierce.

According to the Kessler reference, cited above, it is apparent that prior art investigator Pierce was aware of the inherent bandwidth limitations of the typical field mill. His statement that the time constant exceeds 0.1 second is equivalent to saying that the upper bandwidth limit of a field mill was less than 1.6 Hz. Since a field mill can measure quasi-static fields, this is equivalent to saying that the lower field mill bandwidth limit extends down to DC. Combining these facts gives a specification of the field mill bandwidth of DC to 1.6 Hz.

Studies of atmospheric electricity and other field measurement activities require the capability of measuring the changes in field level that occur at a rate faster than a typical field mill can measure. This requires an instrument with an upper bandwidth limit greater than that of the field mill.

In the Kessler reference, Pierce describes some of the additional instrumentation that could be used to measure rapid changes in the magnitude of electrostatic fields that extend beyond the capability of the prior art field mill. This additional instrumentation takes the form of a slow antenna and a fast antenna. One form of the slow and fast antennae, preferred due to its ease of calibration, is a flat conducting plate of area A, insulated from, but flush with the earth's surface. In accordance with the basic electrostatic theory of field mill operation summarized above, the resulting charge on the flat conducting plate due to the varying field E(t) above the plate is e0*E(t)*k The inherent structure of these antennae and the subsequent amplification can be modeled as a source with a shunting resistance R and capacitance C such that the output voltage will be proportional to e0*E(t) *A/C, with a decay time constant of R*C. In the interest of measurement accuracy, it is prudent that this decay time constant be at least ten times the duration of the change in the electrostatic field to be measured. For a slow antenna, with a typical 10-second decay time constant, the duration is limited to 1 second. For a fast antenna, with a typical 100-microsecond decay time constant, the duration is limited to 10 microseconds.

The time constants that Pierce described can be also stated as the lower bandwidth limit of these types of antennas. A slow antenna with a time constant of 10 s has a lower bandwidth limit of 0.016 Hz, and a fast antenna with a time constant of 100 us has a lower bandwidth limit of 15.9 KHz. Neither of these types of antennas can measure the quasi-static field such as the field mill does, since their lower bandwidth limit does not extend down to DC. This is not possible due to the inherent resistance in the insulator holding the antenna, as well as that of the amplifier circuit. The upper bandwidths of these antennas are limited by the amplifier circuit and the need to discharge the previous measurement before a second measurement is performed. This is why a fast antenna with a low time constant is used for measuring the multiple rapid field changes associated with a return lightning stroke rather than using a slow antenna for both measurements. If this were not done, the amplifier would saturate and thereby be rendered useless for subsequent measurements until returning to equilibrium.

It may be seen that it is necessary to utilize three prior art instruments to measure over the range of bandwidths required to study the field changes associated with storm clouds and the field changes caused by lightning within those storm clouds.

It has been stated that the flat plate field mill, slow antenna, or fast antenna, mounted flush with the ground is the most convenient form factor for calibration. In this case a screen at a height X over the sensor can be charged to a voltage V. The resulting calibration field is simply V/X. It is also prudent to make the dimensions of the screen much larger than those of the sensor to maintain a constant field over the sensor. At the edges of the screen a fringing field effect will cause the field to be at a different level from the desired calibration field.

Although other form factor field mills and field measuring devices are known in the prior art, the flat plate field mill is often used due to its ease of calibration and correlation to the mathematical basis. The other form factor field mills may detect a particular field at a higher or lower level than the standard flat plate field mill due to their geometric factors. A standard flat plate field mill can be used to simultaneously measure a field and determine a gain change required for the alternate form factor field mill such that calibration can be accomplished.

In another chapter of the Kessler reference, W. David Rust and Donald R. MacGorman describe more details of a typical rotating-vane field mill of the flat sensor plate form factor. The field mill they describe has four sensor plates, each occupying 90 degrees of the mechanical rotation of the rotor. The grounded rotor has two 90-degree openings opposed at 180 degrees. The opposing two sensor plates are connected together to form two sensor signals out of phase. The sensor signals (charge) are converted to voltages and are amplified, demodulated, and filtered to obtain a voltage proportional to the field. The example chosen uses an inverting charge amplifier that maintains the sensor plates at ground, an arrangement that has advantages over the non-inverting charge amplifier. Rust and MacGorman state that the ideal waveforms from the charge amplifiers should be triangle waves, but due to the fringing field at the edge of the sensor plates and rotor openings they appear more as sine waves. After demodulation, based on a signal generated by a replica of the rotor disk with openings and an optical interrupter, the signal is filtered to extract the average voltage that is proportional to the field intensity. The resulting upper bandwidth limit is less than 10 Hz. Although this is higher than was achieved by the previous example, it is still unusable to track the rapid changing field conditions associated with storms. This indicates that additional slow and fast antennas are still required to measure the field over the required bandwidth.

The first amplifier stage that processes the sensor signals is critical to the accuracy and performance of the field mill, a slow antenna, or a fist antenna. Besides exhibiting a very high input impedance, low leakage currents, and low noise, the chosen amplifier configuration provides various advantages and disadvantages. The two basic types of amplifier configurations are non-inverting and inverting. In the non-inverting amplifier configuration, the sensor plates have a voltage on them with respect to ground. This requires special insulation and guarding techniques to prevent errors due to leakage currents. Guarding requires driving a shield with the output of the amplifier and can cause a degradation of the upper bandwidth limit. An example of this amplifier is shown in U.S. Pat. No. 3,846,700 to Sasaki et al.

The inverting amplifier configurations are of two types. One is the charge amplifier configuration in which a capacitor element is used in the feedback path such that the output voltage waveform is proportional to the charge on the sensor plates. As the rotor exposes the sensor plate area, the resulting output voltage is ideally a triangular waveform, but is practically observed as being sinusoidal. This implementation is pleasing from a mathematical standpoint, but due to its shape, requires additional filtering to extract the average voltage level. A high impedance resistive element is typically added to the feedback path to provide control of the DC operating point of the amplifier, but this does not modify the basic concept of the charge amplifier, as described by Rust and MacGorman.

The other type of inverting amplifier configuration utilizes a fully resistive feedback element, which defines the output voltage as being proportional to the input current from the sensor plate. Since current from the sensor plate is representative of the rate of change of charge (and area in this case), the resulting ideal waveform is a square wave. In practice, the waveform is more trapezoidal in shape due to the fringing effects at the edges of the sensor plates and at the rotor openings. This amplifier configuration requires less filtering but is more sensitive to rotor speed than the charge amplifier. Wider bandwidths could be achieved with this amplifier over the other amplifier configurations if the effects of fringing were removed. In both inverting amplifier configurations, the sensor plate is held close to ground potential so special guarding and shielding is not required, and the resulting additional bandwidth limitation of the non-inverting configuration is removed.

U.S. Pat. No. 4,370,616 to Williams recognizes some of the advantages of this "low impedance" amplifier configuration used in a non-contact electrostatic voltmeter that is a type of field measuring device. Since the sensor plate is held at ground, no expensive or power inefficient guarding drivers are required, and it is more immune to humidity and contamination on the insulation supporting the sensor plate. This reference also teaches the desirability of having an increased rate of response or bandwidth when such a device is used for making measurements in production applications.

The resulting trapezoidal voltage waveform from the low "impedance" current-to-voltage converter used in a field mill application was not mentioned since the particular device presented uses means other than a grounded rotor, or shutter, to vary the coupling to the field or voltage being measured.

In Chang et al., *Handbook of Electronic Processes*, 1995, New York: M. Dekker, pp. 228–235, the chapter written by Mark N. Horenstein describes several field measuring and non-contact electrostatic voltmeters. It can be deduced by the mathematics presented, explaining the operation of the field mill, that the "low impedance" inverting current-to-voltage amplifier stage was used in this device. The resulting waveform was shown as a square wave (ignoring fringing field effects). This waveform was sampled when the rotor or shutter opening was centered over the sensor plate. Although this method ignores the error associated with the fringing fields at other rotor locations, this sampling at a low multiple of the rotor revolution rate limits the upper bandwidth limit of this device. Another way to view this limitation is to consider that the device is unaware of any field changes in between samples such that rapidly varying fields cannot be measured. Additional filtering of the sampled voltage waveform is also required, which further limits the upper bandwidth limit.

It has been stated that the field mill in a flat plate format is the most general case of the implementation of the instrument and is the most straightforward to calibrate. Many other formats or configurations have been devised to match the measurement application. All of these configurations operate in the same basic method and could all benefit from an increase in upper bandwidth limit.

The flat form factor field mill has a set of sensor plates in a common plane and has the shape of a radial segmented disk. The rotor or shutter is also a disk that is the same size or larger diameter than the sensor array disk. It contains openings that periodically expose the sensor plates below it. Since it is grounded, it shields the corresponding sensor plate below it when the solid portion of the disk is above it. Fields are sensed in an axial direction with respect to the axis of rotation. Examples of this standard configuration can be found in the Kessler and Chang et al. references.

If the flat form factor field mill is inverted such that the sensing direction is toward the earth and elevated a distance above the earth, the effects of precipitation on the sensor plates can be eliminated. Since the elevated field mill assembly is still grounded, some of the lines of the atmospheric field bend around and upward into the sensor plate assembly. The gain of this geometric form factor is different than that of the flush mounted flat form factor field mill. By comparing the readings of these two configurations at the same time at various field strengths and polarities, the inverted form factor field mill may be calibrated. An example of this form factor is described in U.S. Pat. No. 4,424,481 to Larocke et al.

If the perforated rotor and the enclosed segmented sensor plate array are formed in a cylindrical form factor, along with grounded shields at the ends of the rotating cylinder, a field mill is produced that has applications in moving vehicles such as aircraft. In a variation of this cylindrical field mill, the grounded shutter and the insulated sensor plate are opposing hemispheres of the same cylinder. An example of this form factor is shown in the Kessler reference, mounted on the nose of an aircraft. The field is sensed in the radial direction. A particular direction can be selected by the phase of the demodulation signals. In this manner two orthogonal fields can be measured with the same field mill.

Another form factor field mill is formed by shaping the flat form factor field mill into a cone shape. This is done to shed precipitation from the spinning rotor and underlying conical sensor plate array. This allows the field to be sensed in an upright direction and yet have some resistance to the effects of the precipitation. An example of this form factor is shown in U.S. Pat. No. 4,055,798 to Kato.

The shutter mechanism can also be formed with a tuning fork structure powered to maintain the mechanical oscillation. The sensor plates would be shaped in order to be covered by the grounded tuning fork member during part of the oscillation cycle and uncovered during another part of the cycle. Although no rotary shutter is incorporated, the same basic method employed in the rotary field mills is used to measure the field. An example of this form factor is shown in the Chang reference.

In all of the prior art field mill examples described above, the variable coupling of the sensor plates to the field was done with mechanical, moving, grounded shields or shutters. In some applications, the coupling of the sensor plate to the field can be accomplished by electronic means. An electrically modulated grid between the field to be measured and the sensor plate has been described in U.S. Pat. No. 3,812,419 to Kaunzinger et al. A solid state electronic means for intermittently grounding the sensor plate exposed to the field has been described in U.S. Pat. 4,642,559 to Slough. Although these electronic means have some advantages in the areas of power and ruggedness, they may not be suitable in applications requiring high accuracy, sensitivity, and dynamic range, such as is encountered in the measurement of atmospheric electricity. In that application, mechanical shutter field mills still dominate.

A non-contacting voltmeter is another variation on the field mill sensor, as discussed in the previously cited Chang reference, for use in electrostatic laboratories and production lines. Feedback-null surface potential monitors represent one class of non-contacting voltmeter. Such instruments measure the field at a distance from a charged surface. If the charged surface is a conducting surface, its voltage level can be deduced by measuring the field at the sensor.

As discussed above, the upper bandwidth limit of prior art field mills is not high enough to provide all of the field measurements desired for studying storm cloud systems. Rust, David W., *Utilization of a Mobile Laboratory for Storm Electricity Measurements*, Journal of Geophysical Research, vol. 94, no. D11, Sep. 30, 1989, pp. 13,305–13,307 describes a mobile laboratory used to make these types of storm electricity measurements. In this case, a field mill and three flat-plate charge antennae (two slow antennae and one fast antenna) are used to collect the desired bandwidth of data representing the field characteristics below tornado producing thunderstorms.

It can be seen that it would be desirable to provide a wide bandwidth field mill having a bandwidth lower limit from DC to an upper bandwidth limit in the range of frequencies that the fast antenna typically measures. This would allow a single instrument to record all of the data typically requiring three or four instruments to capture. The correlation of the various frequency bands could be completely preserved in a wide bandwidth field mill, thus eliminating the additional timing reference data signals, increased data storage means, and careful processing that are presently required in order to combine the field information from multiple prior art instruments. The higher bandwidth of field mill-like sensors is also desirable in many other applications since it would allow for improved measurements, faster production, and improved research. It would also be desirable to provide a field mill having the capability of rejecting undesirable disturbances and field transients, such that the measurement accurately describes the actual field level over the course of the measurement.

Briefly stated, the present invention involves a novel sensor plate configuration that provides much more information to be processed as compared to the prior art. The present sensor plate configuration provides more continuous exposure to the field being measured and, together with differential signal processing, provides an added degree of suppression of field rate of change transients over prior art low pass filtering. The present invention reduces this filtering need and therefore provides a wider bandwidth capability. Another aspect of the present invention involves generating a new configuration of demodulation signals required to process the signals from the sensor plates. The signals from the sensor plate configuration are processed by two differential signal paths that provide suppression of unwanted signals and increased signal bandwidth and information content to a two-stage demodulator. The two-stage demodulator and a novel timing signal generation configuration provides accurate demodulation of the two differential sensor signal paths into one differential field magnitude and polarity path. This combined data path is further processed to remove the common mode noise and, in one embodiment, to provide a buffered differential signal for the transmission path to a control and display unit. The differential sensor signal paths include AC amplifiers having multiple selectable gains that allow for optimizing the measurement range of the instrument to the field magnitude range of interest. The present invention can be applied to any of the configurations described in the prior art examples presented above to provide significant advantages.

DETAILED DESCRIPTION OF THE PREFERRED EMBODIMENTS

The present invention relates to an electrostatic field measuring device in which a novel sensor plate configuration and associated signal processing circuitry and timing signal generation is employed. Although the present invention has application in various types of field mills, having mechanical or electrical sensor area modulation means, as well as in other field measuring devices, the following description is presented in the context of a flat plate field mill as applied to the measurement of electrostatic fields associated with atmospheric electricity in order that the principles of the invention may be understood.

Figure 1:
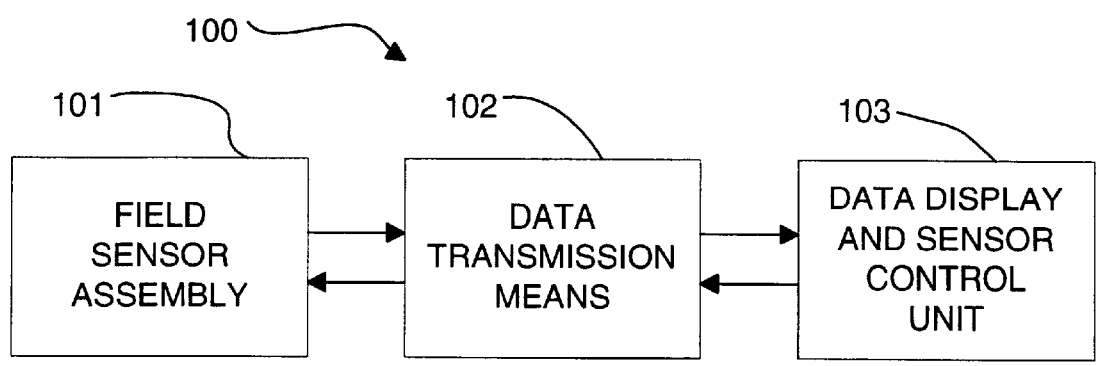
FIG. 1 is a system block diagram illustrating the use of the field sensor assembly of the present invention in a field mill application for measuring atmospheric related electrostatic fields.

Referring now to FIG. 1, there is shown a block diagram of the typical components of a field mill measurement system 100 in accordance with the present invention. A field sensor assembly 101 is typically located in an area remote to a data display and sensor control unit 103, thus allowing field sensor assembly 101 to be located in a generally flat area having no nearby objects such as tall grass, trees, buildings, etc. that could cause perturbations of the field to be measured. When used with a flat plate field mill, field sensor assembly 101 would usually be recessed in to the earth such that the sensor plate elements and the surrounding ground plane are flush with the surface of the earth. This arrangement results in minimal disturbance of the natural electrostatic field that forms between clouds and the earth's surface.

A data transmission means 102 transfers the resulting field measurement signals from the field sensor assembly 101 to the data display and sensor control unit 103. Control signals such as sequencing and gain selection signals can be transferred from data display and sensor control unit 103 to field sensor assembly 101. Data transmission means 102 may represent direct wired electrical connections, channeled or open optical connections, RF connections, or any other suitable data transmission means. In the illustrated embodiment, a differential wire connection is shown to make the system more easily understood, although other means may be preferred in actual applications. Besides preventing the disturbance of the field being measured, physical separation of field sensor assembly 101 and data display and sensor control unit 103 allows the data display and sensor control unit 103, as well as the operator, to be positioned in a safe location isolated from the weather generally, and potential lightning strikes associated with storm clouds, in particular.

Data display and sensor control unit 103 may include signal processing of data received from the data transmission means 102, a display to indicate field magnitude and polarity, computer processing, field data storage, and warning devices. Controls to permit modification of the state of the field sensor assembly 101 may also be included.

Figure 2:
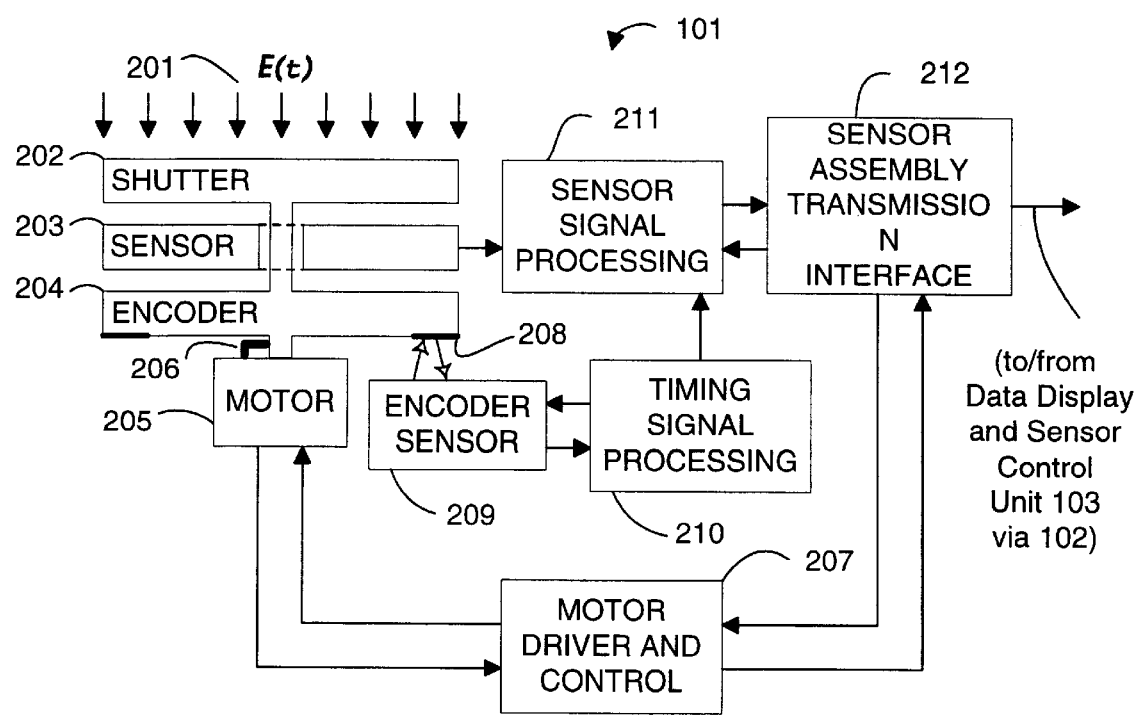
FIG. 2 is a detailed block diagram of the field sensor assembly of FIG. 1.

Referring now to FIG. 2, there is shown a more detailed block diagram of the field sensor assembly 101 of FIG. 1. An electrostatic field 201 to be measured is shown impinging upon a shutter 202 and a sensor 203. Shutter 202 includes openings and solid areas that respectively serve to either allow the field 201 to reach the elements of a sensor 203 or to block it therefrom. Shutter 202 and an encoder 204 at attached to a common shaft driven by a motor 205. This shaft is grounded through motor 205 or, alternatively, by a grounding means 206 to insure that shutter 202 is at the same potential as the case of field sensor assembly 101, which in this embodiment is earth ground. Sensor 203 includes a central aperture that allows the shaft of motor 205 to rotate the shutter 202 and an encoder 204 in conceit, while allowing sensor 203 to remain in a fixed position. Shutter 202, sensor 203, encoder 204, motor 205, and an encoder sensor 209 are positioned perpendicular to field 201 being measured.

Motor 205 may be a conventional brushless DC motor, such as an EC series motor available from JVC Electronics, although other types of commercially available motors could as easily be employed.

Encoder 204 provides commutation or timing signals that are synchronized to the openings and solid areas of the shutter 202. In the preferred embodiment, encoder 204 has an optically reflective surface and a commutation pattern 208 consisting of clear and opaque regions, thereby creating areas regions on encoder 204 that either block light or reflect light. Encoder sensor 209 applies light beams to the surface of encoder 204 and detects the amount of light reflected therefrom. As the encoder 204 rotates, its varying reflectivity generates electrical signals that also vary. Encoder sensor 209 includes two detectors that generate two required signals from two different radii on encoder 204 and commutation pattern 208. Encoder sensor 209 may, for example, be a QRB1114 sensor manufactured by QT Optoelectronics. The above-described method of commutation or timing signal generation has many advantages over the prior art, which uses an optical interrupter type sensor having a light emitter on one side of an encoder disk and a light detector on the other side of the encoder disk. The encoder disk must have openings machined in a pattern that alternately blocks and transmits the light from the emitter to the detector. Aside from the added machining cost, this prior art structure can add imbalance to the rotating assembly, resulting in less accurate timing signals due to the machined opening when compared to the present invention having a surface pattern that is applied to solid encoder disk 204. In addition, unlike prior art encoder disks which require access to both side of the disk, access to only one side of encoder disk 204 is required, thus allowing a lower profile rotating assembly. Besides saving space, this minimizes possible vibrations in the rotating assembly driven by motor 205 that could be detected by the wide bandwidth sensor system of the present invention.

The signals generated by the elements of sensor 203, and which are a function of the magnitude and polarity of field 201, are processed by a sensor signal processing unit 211. Sensor signal processing unit 211 also receives commutation or timing signal inputs from a timing signal processing unit 210. Timing signal processing unit 210 provides output signals to light emitters within encoder sensor 209 and receives signals from the photo detectors within encoder sensor 209. These received signals are processed by timing signal processing unit 210 into a format that is used by sensor signal processing unit 211 as timing information for the demodulation process. Sensor signal processing unit 211 provides signals indicative of the polarity and magnitude of the field 201 being measured to a sensor assembly transmission interface 212. Sensor signal processing unit 211 also receives gain selection, adjustment, and other control signals from sensor assembly transmission interface 212.

Sensor assembly transmission interface 212 conditions signals from sensor signal processing unit 211 and other circuitry illustrated in FIG. 2 into a format and medium compatible with data transmission means 102 of FIG. 1. The signals to be conditioned convey polarity and magnitude information regarding field 201 and status information relative to field sensor assembly 101. In a similar manner, control signals relating to gain selection and sequencing from data transmission means 102, initially generated by data display and sensor control unit 103, are conditioned to an electronic signal format compatible with circuitry within field sensor assembly 101.

A motor driver and control unit 207 provides drive signals to motor 205 and receives timing or magnitude information therefrom. The configuration of the motor driver and control unit 207 is a function of the chosen type of motor 205. Since it is desirable to rotate shutter 202 and encoder 204 at a high constant speed without generating electrical noise, a DC brushless motor 205 and a DC brushless motor driver and control unit 207 is preferred in this embodiment. Motor driver and control unit 207 may comprise a commonly available HA13561 driver integrated circuit manufactured by Hitachi. The specification sheet for this device details the connections and external circuitry required to drive motor 205 at a constant speed which, in this embodiment, was chosen to be 5400 RPM.

Figure 3A:
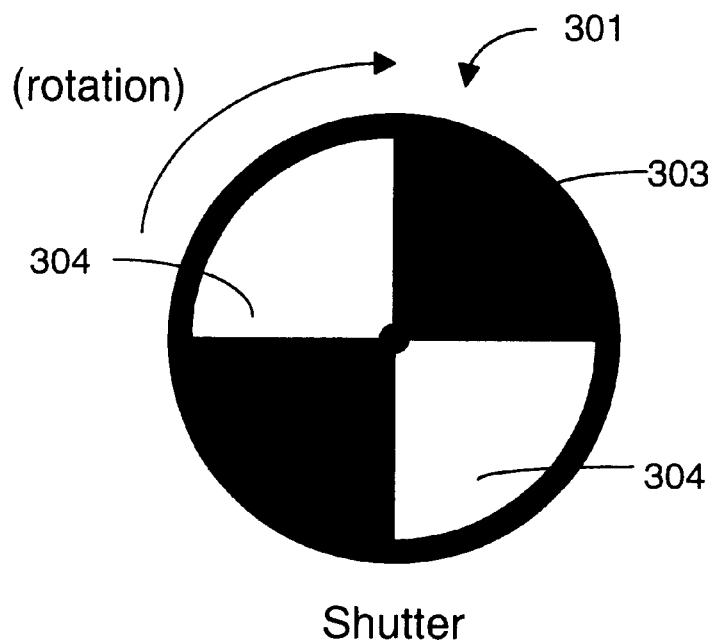
FIGS. 3A and 3B are diagrams illustrating shutter and sensor configurations, respectively, employed in prior art field mills.
Figure 3B:
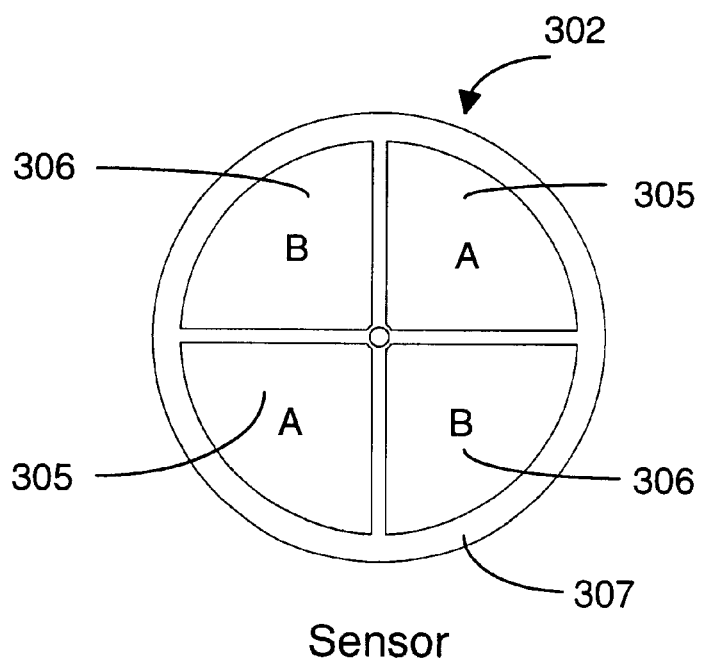

In order to understand the novel sensor structure and benefits of the present invention, the layouts of a shutter and sensor utilized in a prior art field mill are shown in FIGS. 3A–B for comparison. A shutter 301, illustrated in FIG. 3A, rotates between a sensor 302, illustrated in FIG. 3B, and the field being measured. Shutter 301 is grounded via the supporting motor shaft that is itself grounded within the motor or by an additional brush type assembly. Prior art shutter 301 includes two open areas 304 and a closed, grounded area 303. Other prior art field mills include more shutter openings in order to increase the commutation frequency without increasing the rotational speed of the shutter. An outer ring of shutter 301 is also grounded to provide shielding from fringing field effects, although other designs do not employ a grounded outer ring, so that the grounded areas resemble a flat fan.

Prior art sensor 302, illustrated in FIG. 3B, has four conducting areas supported on an insulated support 307. Areas 305 marked "A" are electrically connected together to produce one sensor output, and areas 306 marked "B" are connected together to produce a second sensor output.

Figure 4:
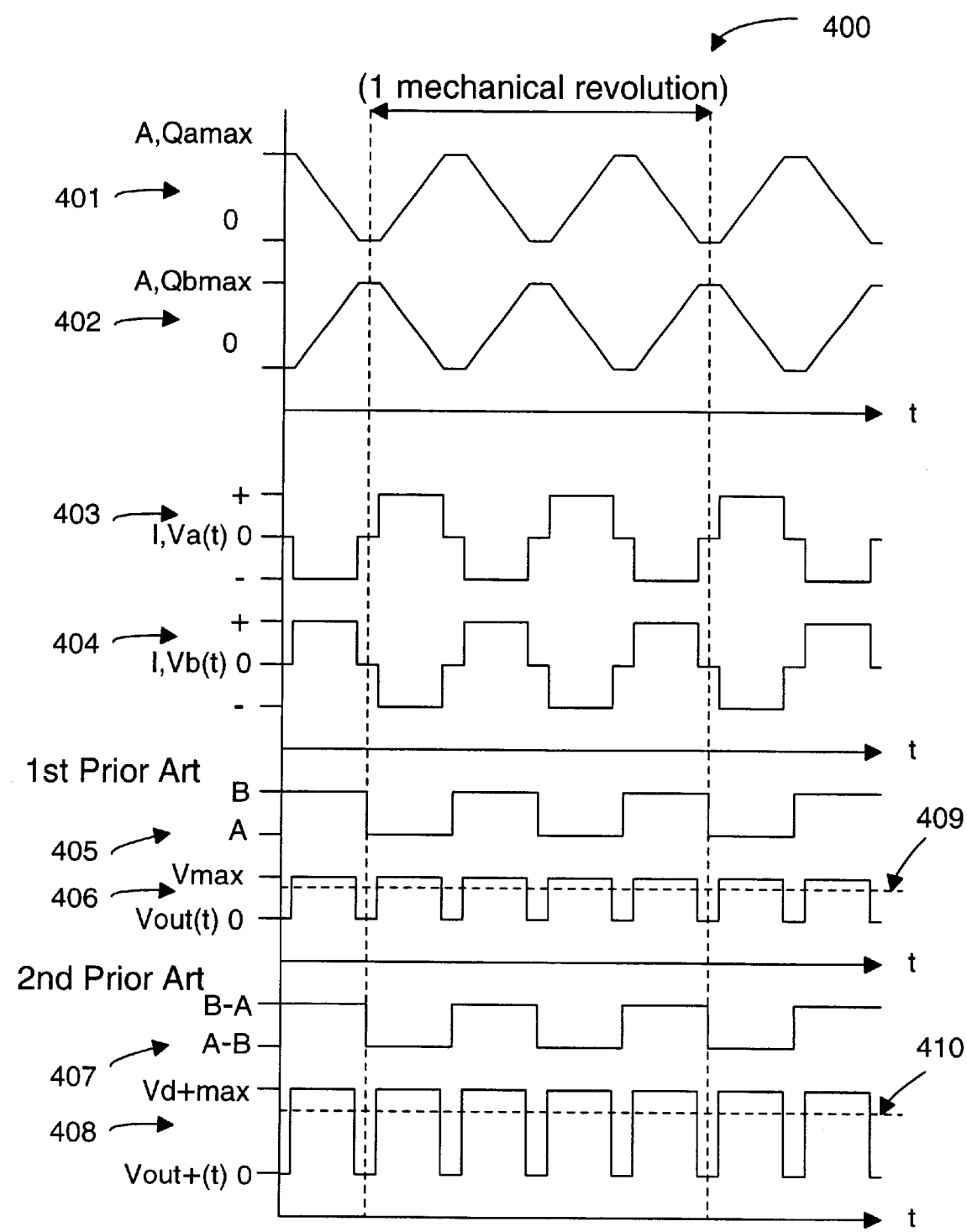
FIG. 4 is a waveform diagram illustrating typical waveforms generated by a prior art field mill sensor and its associated electronics.

Typical waveforms produced by prior art field mills are shown in FIG. 4. The waveforms are aligned on a common horizontal time axis chart 400, and the time range for a single revolution is marked by two vertical dashed lines. The waveform 401 shows the variation of the "A" sensor effective area 305 exposed to the field being measured. The charge on the plates is proportional to the exposed area, so this represents the charge on the "A" sensor plates as well. When the shutter 301 is aligned over the sensor 302 in the orientation shown in FIGS. 3A–B, "A" sensor plate areas 305 are totally covered by the grounded areas 303. This is shown as the "0" areas or charge regions of waveform 401. As the shutter rotates clockwise over the sensor, more of the "A" sensor plate areas 305 are exposed to the field being measured. After 90 degrees of rotation the "A" sensor plate areas 305 are aligned with the open areas 304, and the entire surface is open to the field being measured. The "A,Qamax" value regions of waveform 401 correspond to that condition. From the ideal standpoint, the waveform should be a triangle wave. In practice, the fringing field at the edges of the shutter 301 and sensor 302, as well as the insulated gaps between sensor elements, cause a rounded non-linear region of the waveform 401. This is represented as the flat sections of the waveform 401 that is sufficient to explain the operation of the demodulation process.

Waveform 402 is the same type of waveform explained above but for the "B" sensor areas 306. The waveforms 401 and 402 are electrically 180 degrees out of phase. Both waveforms complete two cycles per single revolution of the motor.

The varying charge on the sensor plate 302, due to the varying area exposed to the field being measured, can be processed initially by two different amplifier configurations. A charge amplifier has been used to convert the varying current from the sensor plate 302 to a voltage proportional to charge. The output of this first amplifier would have a wave shape similar to waveforms 401 and 402. These are typically peak detected or sampled at the peak. Either method results in a low bandwidth system. The second configuration is the transimpedance amplifier. This amplifier configuration produces a voltage that is proportional to the input current. Both of these amplifier configurations are well known to those skilled in the art. The present invention uses the transimpedance amplifier configuration for its numerous advantages and the need to provide a wide bandwidth signal path. In order to provide a clear comparison between the prior art and the sensor of the present invention, this prior art description will use the transimpedance amplifier configuration since that is what is used in the present invention.

As the shutter 301 alternately shields and exposes the sensor plate 302 to the field being measured, this area and the resulting charge Q on the sensor plate 302 has been shown to have a wave shape like that of waveforms 401 and 402. Current is defined as I(t)=dQ/dt or the time rate of change of charge. This current is shown in waveforms 403 and 404, respectively. In the case of the transimpedance amplifier, the output voltage is proportional to input current. Therefore, waveforms 403 and 404 also represent the output voltage of the first stage of amplification. In practice, the amplifier also inverts the polarity of the waveform, but this is not shown since it does not simplify the discussion and can be compensated for by the connection to the following amplifier stages. Note that the flat, non-zero values of waveforms 403 and 404 correspond in time to the linear slopes of waveform 401 and 402. In these prior art waveforms, this is the only usable part of the signal.

Waveform 405 shows a logic signal that is generated by the encoder disk, optical interrupter, and signal processing electronics of one prior art configuration. When applied to the appropriate demodulation circuit, it selects the Va waveform 403 when it is in the low state and selects the Vb waveform 404 when it is in the high state. The resulting output voltage from the selection or demodulation process is shown as waveform 406. It can be seen that this process selects the positive regions of either waveform 403 or 404, as available. This single ended Vout(t) waveform 406 is then filtered by means of a low pass filter to remove the missing signal areas or notches and to obtain the average value 409 of the waveform that is proportional to the field being measured. This low pass filtering process severely limits the bandwidth of the measurement system. The present invention eliminates the need for excessive low pass filtering and therefore achieves a wider bandwidth.

In a second prior art configuration, it was observed that there were also negative usable regions of waveforms 403 and 404. In this case, the logic signal 407 selects positive regions of either waveform 403 and 404 and subtracts the simultaneous negative regions to produce voltage waveform 408. This is twice the amplitude of the waveform 406, which is advantageous, although the timing is the same, and the need for significant low pass filtering is still required to obtain the average value 410. This second prior art configuration still exhibits low bandwidth. Again, the present invention does not require this significant low pass filtering and, therefore, can achieve a wider bandwidth.

Figure 5A:
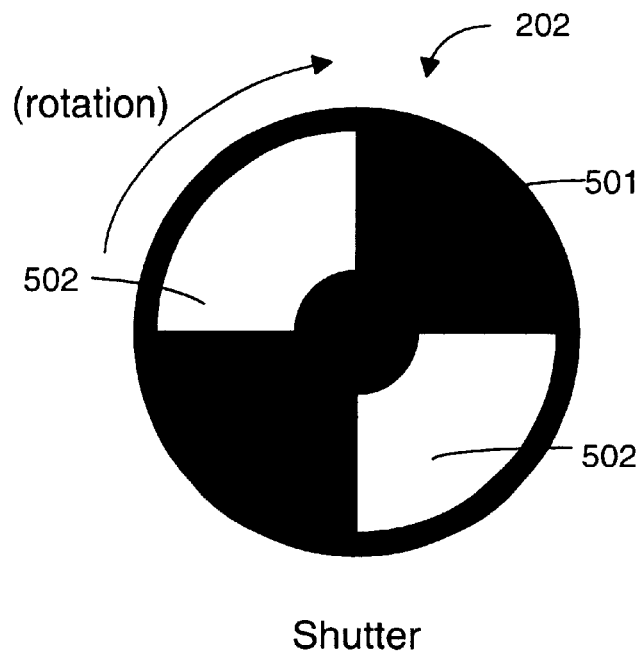
FIGS. 5A and 5B are diagrams illustrating shutter and sensor configurations, respectively, employed in the field sensor assembly of the present invention.
Figure 5B:
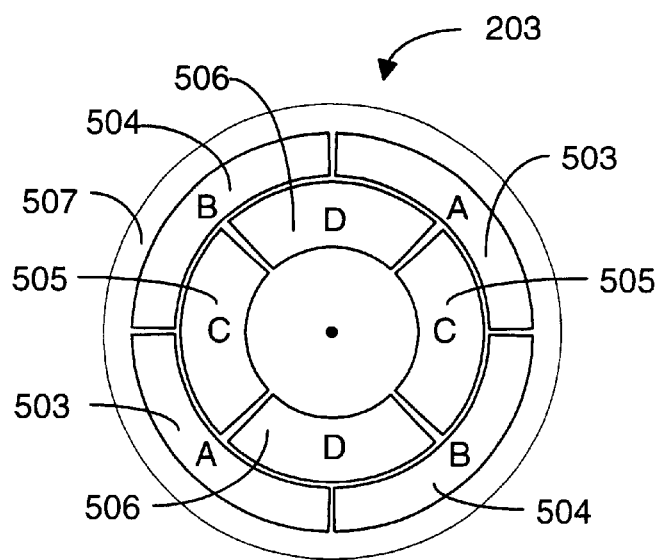

Referring now to FIGS. 5A–B, there are shown a shutter 202 and a sensor 203, constructed in accordance with the preferred embodiment of the present invention, for employment in a field mill. Shutter 202 includes a grounded area 501 and open areas 502. Unlike the shutter of the prior art, there is no need to increase the number of openings to increase the commutation frequency. The present invention achieves much wider bandwidth without providing additional openings in the shutter 202. Sensor 203 includes four conducting sensor segments 503, 504 at outer ring positions thereof Two "A" segments 503 are electrically connected, and two "B" segments 504 are likewise electrically connected. A differential signal generated from these segment pairs 503, 504 will hereinafter be referred to as the "normal" signal. The normal signal has characteristics similar to those of the total signal produced by the 2nd prior art field mill described above. Four additional conducting segments 505, 506 are provided at inner ring positions of sensor 203, insulated from each other, as well as from conducting segments 503, 504 and ground by means of an outermost insulator ring 507 provided along the peripheral edge of sensor 203. Two "C" segments 505 are electrically connected together and the two "D" segments 506 are also electrically connected together. The differential signal generated from segment pairs 505, 506 will hereinafter be referred to as the "quadrature" signal. The electrical phase difference between the normal and quadrature signals is 90 degrees in this embodiment. Their mechanical angular displacement is 45 degrees so as to produce the 90 degrees of electrical phase shift over two electrical cycles per mechanical revolution. The segments 503, 504, 505, 506 of FIG. 5B may not be illustrated to exact scale, but are shown with the proper angular placement and layout. In the preferred embodiment of the present invention, it is desirable that conducting segments 505, 506 occupy the same area as that of conducting segments 503, 504 to insure that the normal and quadrature signals will be of equal magnitude for the field be measured. This arrangement also serves to provide additional transient field suppression as will be detailed hereinbelow.

As illustrated in FIGS. 5A–B and described above, four sets of conducting segments 503, 504, 505, 506 include two electrically connected segments per set to produce the four sensor signals 701. In combination with the matching grounded rotating shield or shutter 202, this configuration provides two differential, quadrature sensor signal pairs. While no additional benefits are achieved thereby, the number of conducting segments may be increased. In that case, the geometry of shutter 202 and encoder 203 would be modified, and the electronics required to process the additional signals would be increased, accordingly.

For example, six sets of conducting segment pairs could be provided, with a circumferential displacement therebetween of 30 mechanical degrees, along with a matching shutter or shield geometry that would provide three differential pair signals having 60 electrical degrees of phase offset, resulting in a three-phase system rather than the quadrature system having 90 electrical degrees of phase offset shown and described in accordance with FIGS. 5A–B.

While the number of electrically connected segments per set may be more or less than the two illustrated and described in accordance with FIGS. 5A–B, the choice depends on the means for exposing and shielding the segments from the field being measured. Thus, many numbers and shapes of segments could be chosen to provide the signals 601, 602, 603, 604 described below.

Figure 6:
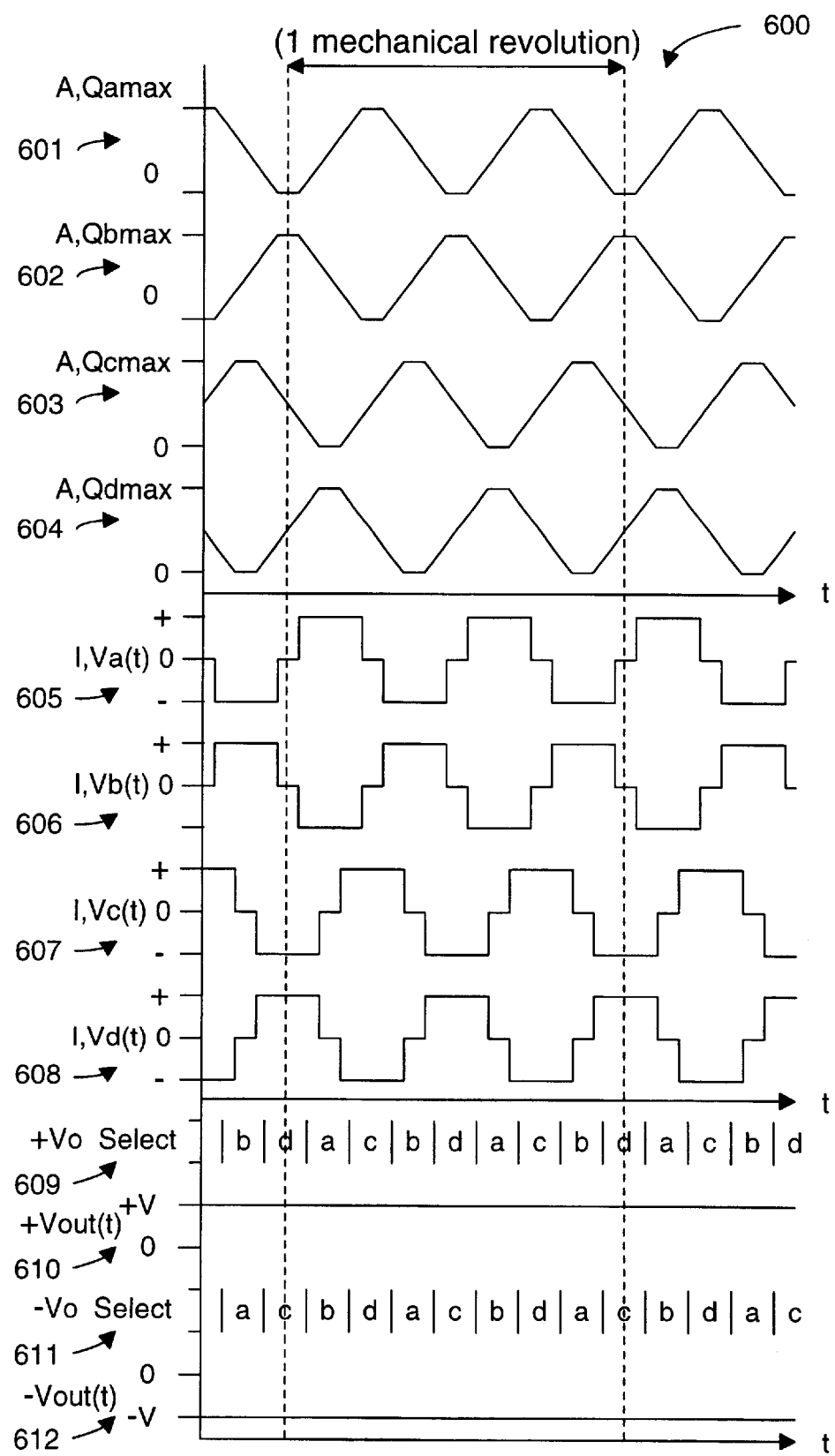
FIG. 6 is a waveform diagram illustrating various waveforms generated by the field sensor assembly and associated electronics of the present invention.

Referring now to FIG. 6, there is shown a set of waveforms produced when the preferred sensor of the present invention is employed in a field mill. All of the waveforms are shown on a common time axis 600, and the time for one mechanical revolution is shown by two vertical dashed lines. Waveforms 601 and 602 are of the normal signal, generated by the "A" and "B" conducting segments 503, 504, respectively, and have the same characteristics of the prior art "A" and "B" waveforms 401, 402 shown in FIG. 4. Waveforms 603 and 604 are of the quadrature signal, generated by the "C" and "D" conducting segments 505, 506, respectively, and are not available from the prior art sensor. The phase relationship shown assumes a clockwise rotation of shutter 202 over sensor 203 as seen from the field being measured. Counter clockwise rotation can be used as well, with appropriate changes to the commutation pattern 208 on encoder 204. Waveforms 605, 606, 607, and 608 of FIG. 6 represent the output voltages of four transimpedances amplifiers, with no inversion for clarity of explanation. These waveforms are the derivatives of waveforms 601, 602, 603, and 604, respectively.

Referring again to the preferred embodiment of FIG. 2, a set of signals is generated by way of reflective encoder disk 204 having a non-reflective pattern 208 thereon by way of reflective optical sensor 209. Other methods may be employed to generate these signals. The signals from encoder sensor 209 are processed by timing signal processing block 210 to produce signals to control the selection or demodulation process. Although in the preferred embodiment, two binary signal lines are used to select one of four possible selection states, the waveforms 609 and 611 of FIG. 6 indicate the signal selection state active at that time to aid in the clarity of this description.

Waveform 609 shows the present selected output voltage from the four transimpedance amplifiers. It can be seen that at each selection window, a usable section of the voltage waveforms is selected. The output voltage of the selection or demodulation process is differential. Waveform 610 shows the positive output voltage line of the differential pair of signals. Since a usable signal is now available at all selection times, the output waveform is constant for a constant field being measured. This feature of the present invention eliminates the need for significant low pass filtering, as taught by the prior art, in order to eliminate the notches or extract the average value of the output signals and, therefore, allows a wide bandwidth to be achieved. Commutation selection waveform 611 and the associated output voltage waveform 612 operate in a similar manner, with different selection states to generate the negative output voltage line of the differential pair of signals.

As further illustrated in FIGS. 5A–B and described above, the means for shielding and exposing the conducting segments of sensor disk 203 to the field being measured are provided by a rotating, grounded shutter 202 having a pattern of apertures thereon. The shape of a mechanically moving shield and the conducting segments can be modified as desired and still substantially provide the signals 601, 602, 603, 604 described above. In addition, the effective area of the conducting segments may be varied by electronic means rather than mechanical means, as described above. For example, a perforated conducting shield may be employed between the field being measured and the conducting segments. Varying the voltage on the perforated conducting shield varies the effective area of the conducting segments that are exposed or shielded from the field being measured and, thus, can substantially produce the signals 601, 602, 603, 604. As a further example, the effective area of the conducting segments may be varied by partitioning them into sub-segments and selectively connecting and disconnecting the sub-segments by means of a solid state switch to the sensor output signals, thereby affecting the amount of total conducting segment area exposed to the field being measured to thereby substantially produce the signals 601, 602, 603, 604.

For purposes of simplicity and clarity of description of the present invention, FIG. 2 and its associated detailed description are directed to those electronic blocks necessary to practice the invention. However, additional blocks of circuitry are desirable in a typical application to provide increased, selectable gain and electronic disturbance rejection. Suggested additional electronic circuitry is presented below.

It has been shown that the present invention eliminates the need for significant low pass filtering and therefore allows a wider bandwidth system. Another related advantage can be achieved by correlating the selection window times of waveforms 609, 611 with the charge waveforms 601, 602, 603, 604. It can be seen that these times occur during the linear slope portions of these charge waveforms. These portions are generated as the edges of the shutter 202 change the area of the conducting segments of sensor 203 that are exposed to the field being measured. This means that the field being measured always has a continuous path to the output voltage, which allows for a change of the field at any time to cause an associated change in the output voltage. In the prior art, the field being measured is only continuous to the output voltage at certain times during the commutation process. Thus, even if low pass filtering were not used, a change in the field being measured may not be detected until a later time, depending on the state of the selection process. The present invention also provides this advantage over the prior art.

Figure 7:
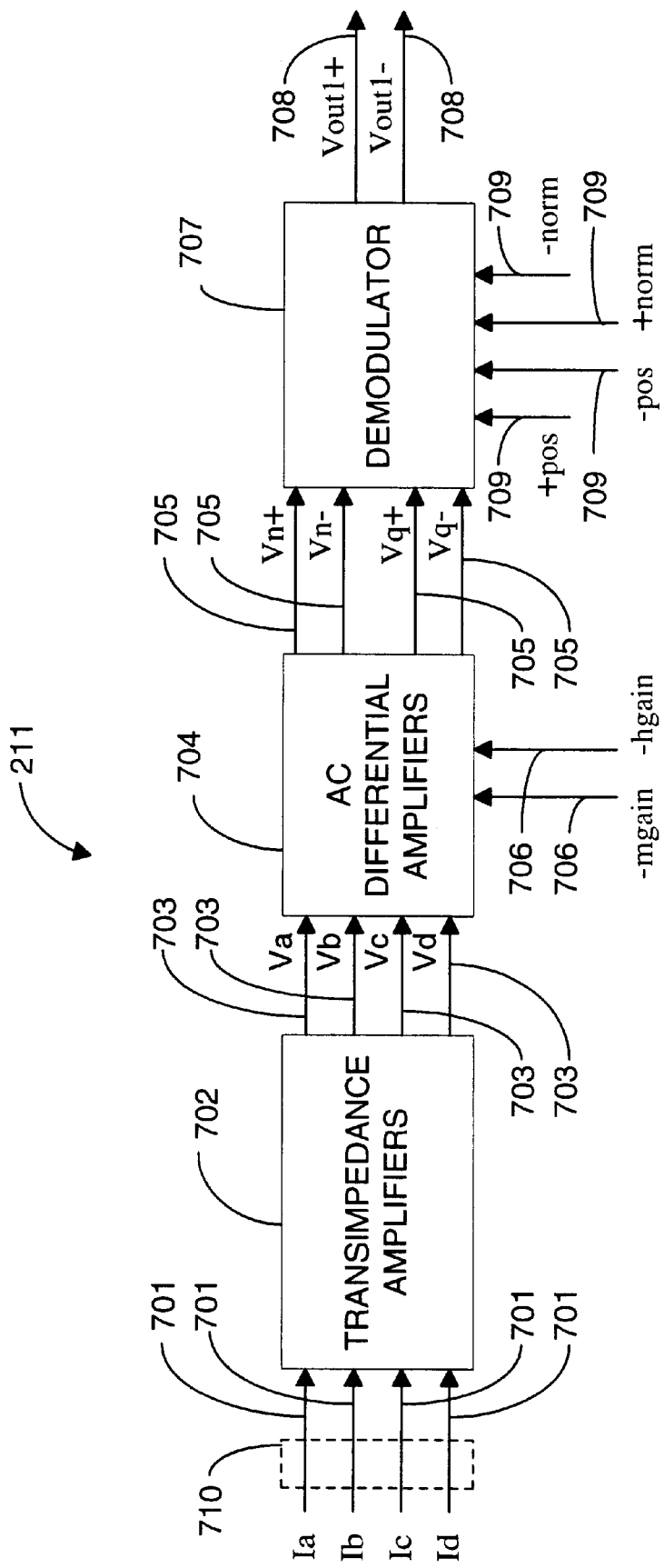
FIG. 7 is a detailed block diagram of the sensor signal processing block of FIG. 2.

Referring now to FIG. 7, there is shown the sensor signal processing block 211 of FIG. 2, in more detail. Four current signals 701 from the four sensor segment pairs 503, 504, 505, 506 are first processed by a transimpedance amplifiers block 702. In some applications, it may be desirable to add RF filters or transient suppressors as an optional block 710 in the input lines 701 to transimpedance amplifiers block 702. Due to the fact that the transimpedance amplifiers block 702 forces the four input signals 701 and the sensor segments 503, 504, 505, 506 to ground potential allows simple networks to be used, if needed, to prevent amplifier damage or large errors due to interference.

The transimpedance amplifiers block 702 converts the four current input signals 701 into four voltage signals 703. The AC components of these signals are amplified by an AC differential amplifiers block 704 into two sets of differential output signals 705. Signals from sensor segment pairs 503, 504 are amplified differentially to form output signal Vn+ and its inverse Vn−. In a similar manner, the signals from sensor pairs 505, 506 are amplified differentially to form output signal Vq+ and its inverse Vq−. Although the field to be measured has DC components to be measured, the rotating shutter 202 between the field and sensor 203 modulates the signals into AC signals that are amplified, while the undesirable DC offset in the AC differential amplifiers block 704 is not amplified. In the preferred embodiment of the present invention, three gain or sensitivity functions are user-definable such that a wide range of field magnitudes can be measured while maintaining good output resolution. The gain selection is controlled by a pair of lines 706 that originate in the data display and sensor control unit 103 and are provided as inputs to AC differential amplifiers block 704. All signal processing following the transimpedance amplifiers block 702 is performed on differential signals in a differential manner such that any interference present or introduced during this stage of processing is cancelled out or suppressed.

The two differential signal pairs 705 are demodulated by a demodulator 707 into a single differential output signal pair 708. The demodulation process is controlled by a plurality of gating or selection signals 709 that are generated in timing signal processing block 210 based on signals from encoder sensor 209 as it measures the reflectance of encoder 204 and commutation pattern 208. The output signal pair 708 connects to sensor assembly transmission interface 212 to be conditioned prior to being applied to data display and sensor control unit 103 via data transmission means 102.

Figure 8:
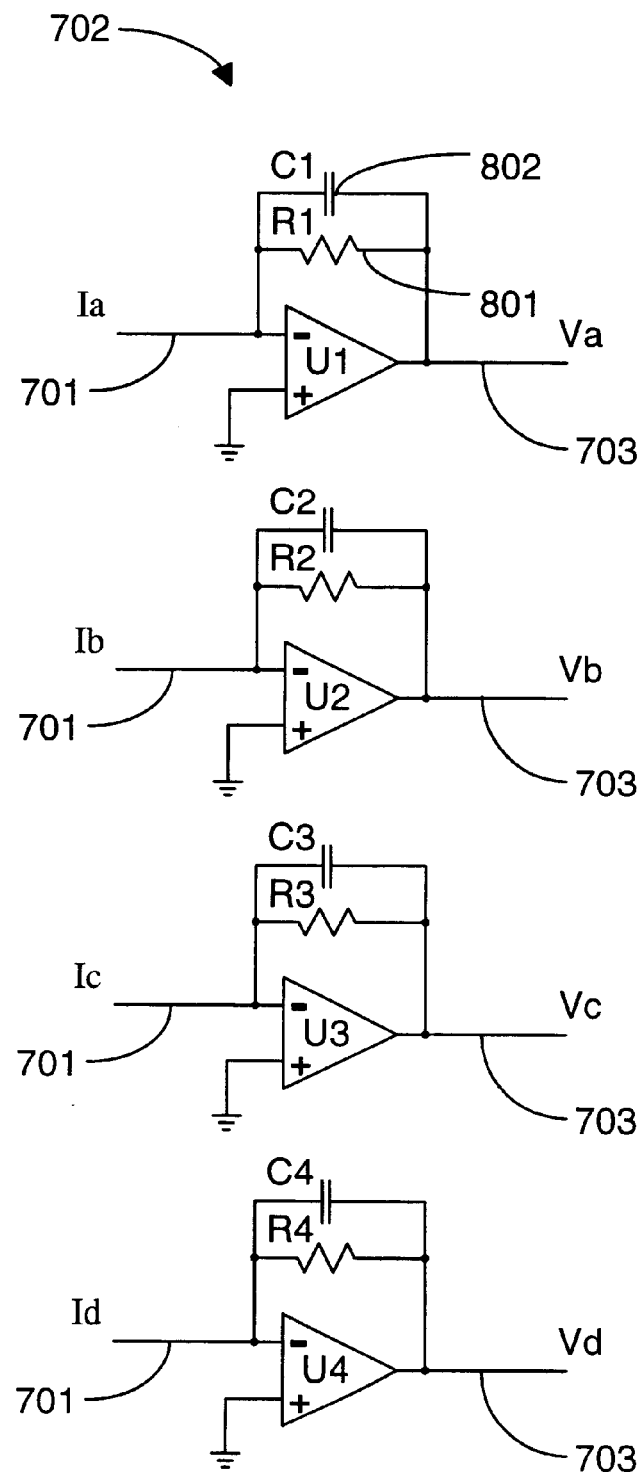
FIG. 8 is a detailed circuit diagram of the transimpedance amplifiers block of FIG. 7.

Referring now to FIG. 8, there is shown a detailed circuit diagram of the transimpedance amplifiers block 702 of FIG. 7. Four essentially identical transimpedance amplifier circuits are employed, each including an amplifier chosen to have very low input currents compared to the currents from the sensor segment signals 701 being measured. An LMC6484A, manufactured by National Semiconductor has been found to be sufficient. This component contains four amplifiers in one integrated package such that all four signals can be processed in a single integrated circuit and such that matching between signal paths is maintained. Although transimpedance amplifier design is well know in the art, transimpedance amplifiers block 702 has been designed to have a gain of 787,000 V/A and a bandwidth of 10 KHz. This bandwidth was chosen to be 1000 times higher than the 10 Hz bandwidth of typical prior art field mills. 10 KHz is not to be considered an absolute bandwidth limit of the present invention, since higher bandwidths can be achieved, based on amplifier choice and sensor configuration. A resistor 801 sets the gain of each of the transimpedance amplifier circuits within transimpedance amplifiers block 702 and may be changed slightly in value to compensate for slight differences in the effective areas sensor segment pairs 503, 504, 505, 506 such that output signals 703 from each of the transimpedance amplifiers are equal in amplitude.

Figure 9:
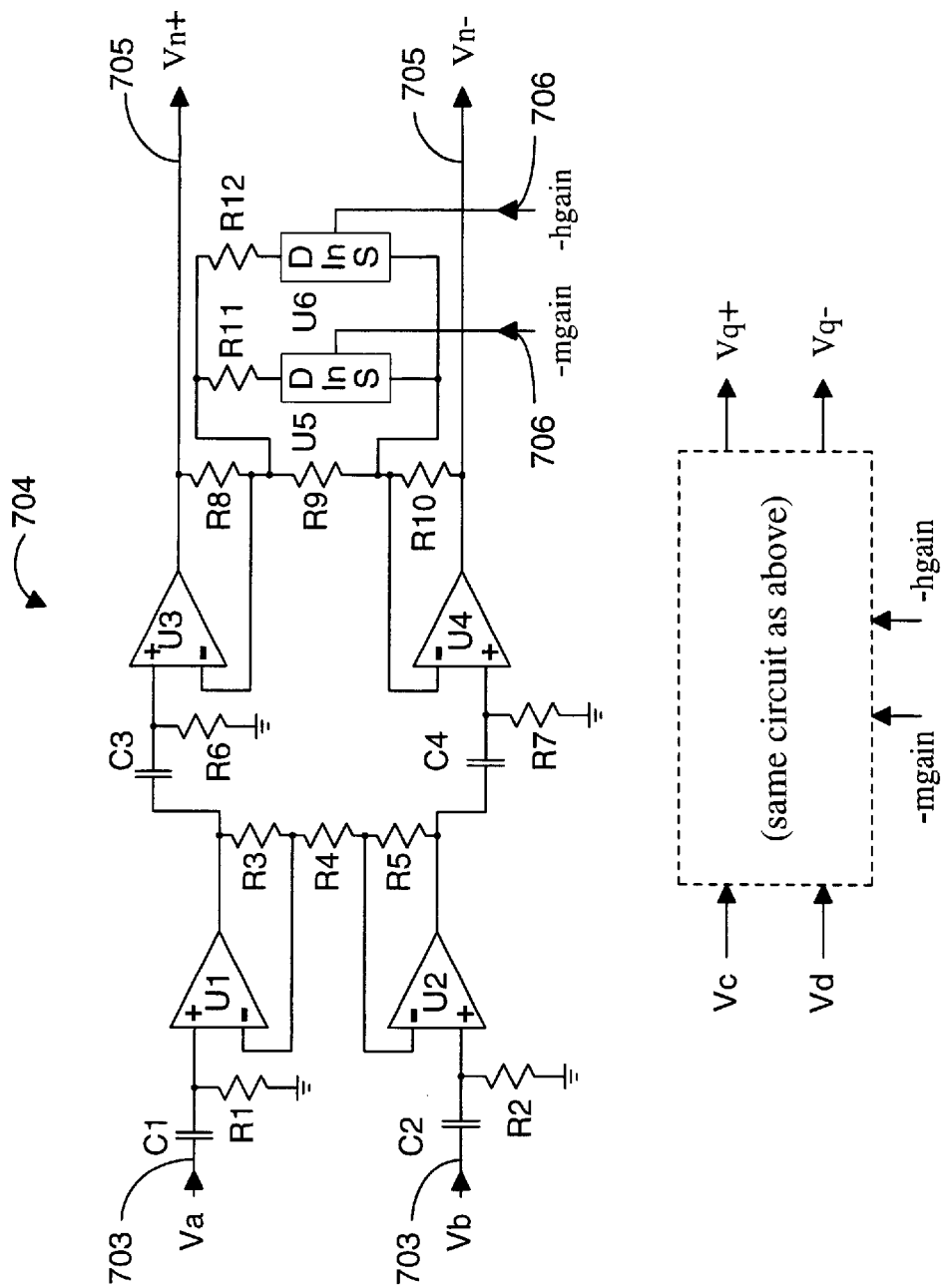
FIG. 9 is a detailed circuit diagram of the AC differential amplifiers block of the FIG. 7.

Referring now to FIG. 9, there is shown a detailed circuit diagram of AC differential amplifiers block 704. The two identical AC differential amplifiers within differential amplifiers block 704 may comprise, for example, an LMC6484A integrated circuit manufacture by National Semiconductor. A pair of FET switches U5, U6 may comprise an ADG511 integrated circuit manufactured by Analog Devices. Each of these components includes four switches, so that one integrated circuit provides the FET switches U5, U6 required for both differential amplifiers to thereby maintain the desired matching. Each of the FET switches U5, U6 can be viewed as a SPST switch between its "S" and "D" terminals, controlled by the "In" terminal. A first AC differential amplifier processes the normal signals Va and Vb into the differential output signals Vn+ and Vn−, while a second identical AC differential amplifier, represented in the dashed line box of FIG. 9, processes the quadrature signals Vc and Vd into the differential output signals Vq+and Vq−.

The differential input signal pair 703 is initially high pass filtered at a frequency of 0.31 Hz by components R1, C1 and R2, C2 in order to remove any DC offset associated with the preceding transimpedance amplifiers block 702. The remaining AC signal is amplified by individual amplifiers U1, U2, whose gain is set by resistors R3, R4, R5. This output is again high pass filtered by components R6, C3 and R7, C4 to remove any DC offset component. The differential signal so filtered is then amplified by individual amplifiers U3, U4, whose gain is set by resistors R8, R9, R10 and, conditionally, by resistors R11, R12, depending on the state of FET switches U5, U6. Gain select signals 706 allow for three gain settings of the AC differential amplifiers in order to provide three full-scale sensitivity ranges within the same instrument. If FET switches U5, U6 are off, the gain is set at its lowest value. If FET switch U5 is on and FET switch U6 is off, the gain is set at an intermediate value. If FET switch U5 is off and FET switch U6 is on, the gain is set at its highest value.

The foregoing configuration of an AC amplifier is well known to those skilled in the art. The selection of gain values depends on the size of sensor 202 and the gain of transimpedance amplifiers block 702, as well as the desired output voltage level. In the preferred embodiment of the present invention, the AC gains are 112, 375, and 1120 V/V differential. The outer radius of the sensor 203, shown in detail in FIG. 5, is approximately 3.5" in diameter, for example.

Figure 10:
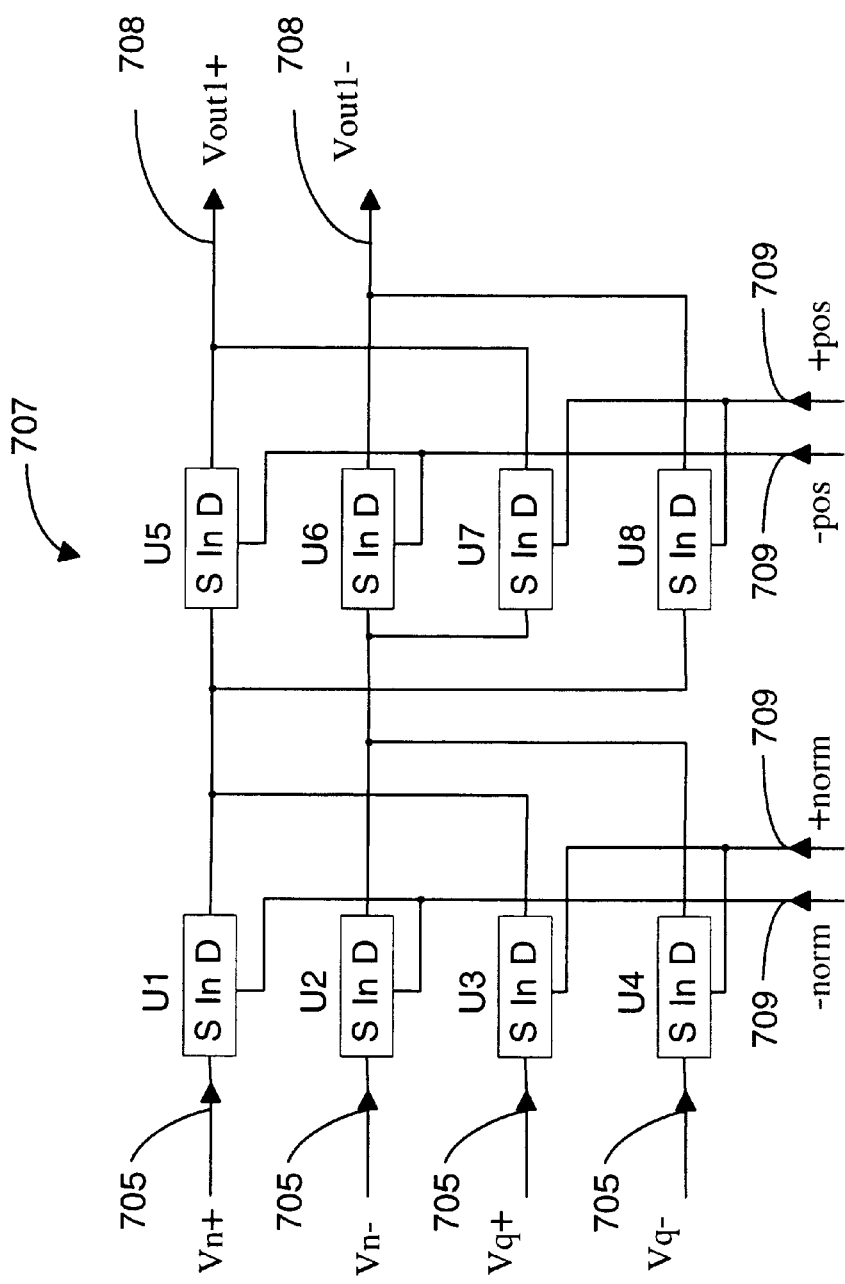
FIG. 10 is a detailed circuit diagram of the demodulator block of FIG. 7.

Referring now to FIG. 10, there is shown a detailed circuit diagram of demodulator 707 of FIG. 7. Eight FET switches U1–U8 may comprise, for example, a pair of ADG511 integrated circuit packages manufactured by Analog Devices, each of which packages contain four FET switches. These switches can be viewed as SPST switches that connect the "S" terminal to the "D" terminal when the "In" terminal is low. If the "In" terminal is high, the switch is open. It can be seen that the demodulation process is a switching process which, in the present invention, selects either the normal or quadrature signals 705 and either passes the selected signal in non-inverted form or inverts it to the output 708. FET switches U1, U2, U3, U4 serve to select the normal signal when a +norm control signal 709 is in the high state and its complement control signal −norm is low. The quadrature signal is selected when +norm control signal 709 is low and its complement −norm is high.

The second stage of switching within demodulator 707 is performed on the selected signal by FET switches U5, U6, U7, U8. When a +pos control signal 709 is high and its complement −pos is low, the selected signal (either normal or quadrature) is passed in non-inverted form. If +pos control signal 709 is low and its complement −pos is high, the selected normal or quadrature signal is inverted. In any case, one of the input signal pairs, either inverted or non-inverted, is connected to the output 708.

It is important that the +norm, −norm, +pos, and −pos control signals 709 switch at the same instant of time if a change of level is required. Timing signal processing block 210, encoder sensor 209, encoder 204, and its commutation pattern 208 are designed in a novel configuration that insures this condition and others previously are met.

Figure 11:
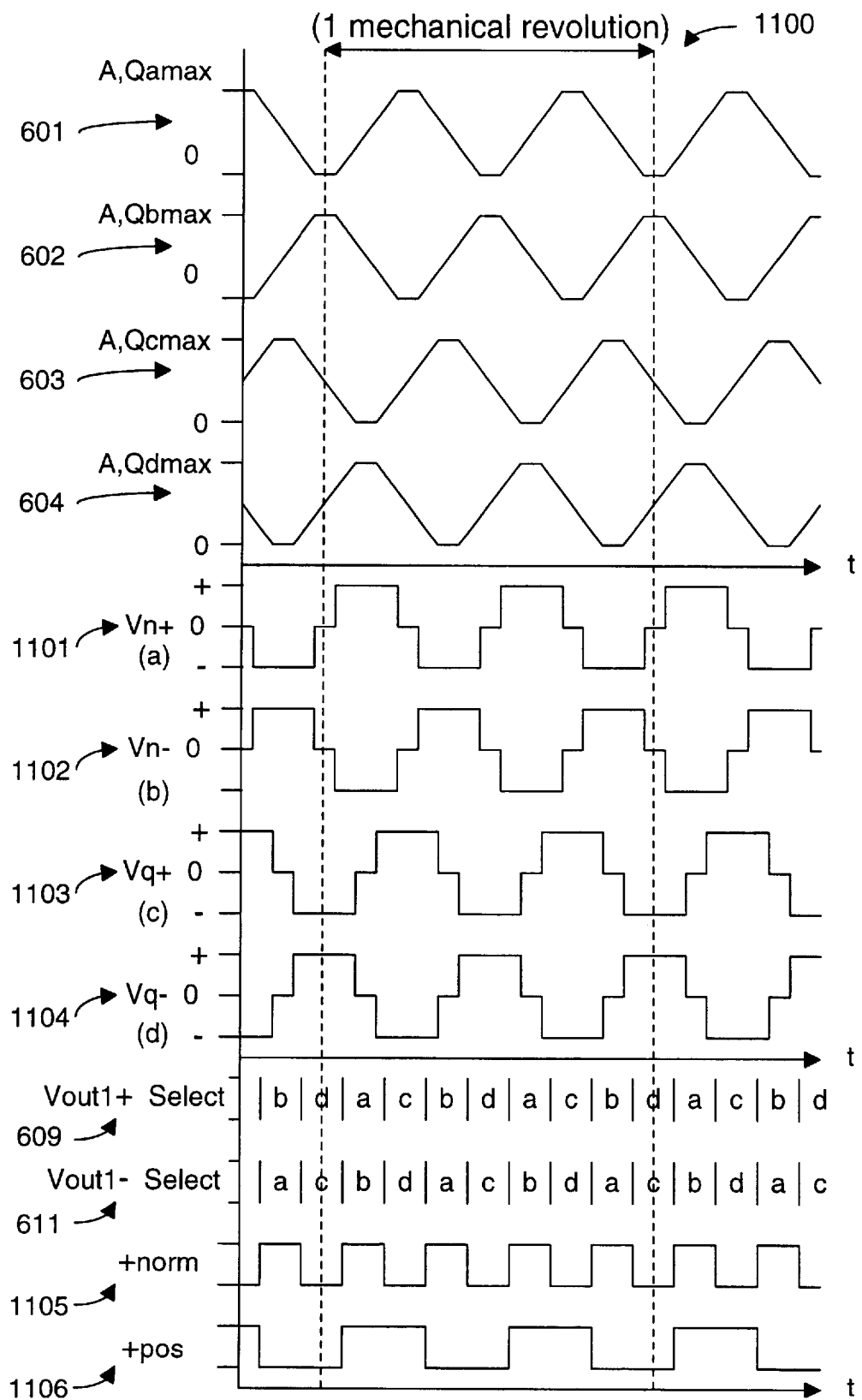
FIG. 11 is a waveform diagram illustrating waveforms associated with the demodulator of FIGS. 7 and 10.

Referring now to FIG. 11, there is shown a waveform diagram illustrating how control signals 709 relate to various other signals. Signals associated with sensor 203 are shown as waveforms 601, 601, 603, and 604. These waveforms are the same as shown in FIG. 6 and are presented again for purposes of easy reference. Waveforms 1101, 1102, 1103, and 1104 are waveforms of the input signals 705 to the demodulator 707 received from the AC differential amplifiers block 704. Waveforms 609, 611 are the signal selection waveforms associated with signal +Vout1+ and Vout1−, respectively, as illustrated in previous FIG. 6. By comparing the above-mentioned waveforms to waveforms 1105, 1106 of control signals 709, it can be seen that this desired selection sequence is provided by these signals and demodulator 707.

Only the positive ones of the control signals 709 are illustrated in FIG. 11 as waveforms 1105, 1106, since their inverted counterparts have the same timing. +norm control signal 1105 selects either differential signal pair 1101, 1102 or differential signal pair 1103, 1104. +pos control signal selects either the positive signal of the differential signal pair for the positive output and the negative signal of the differential signal pair for the negative output (non-inverted), or it crosses the signal such that the selected differential signal pair is inverted to the output. This system is totally differential and therefore has increased noise immunity over other prior art methods.

Figure 12:
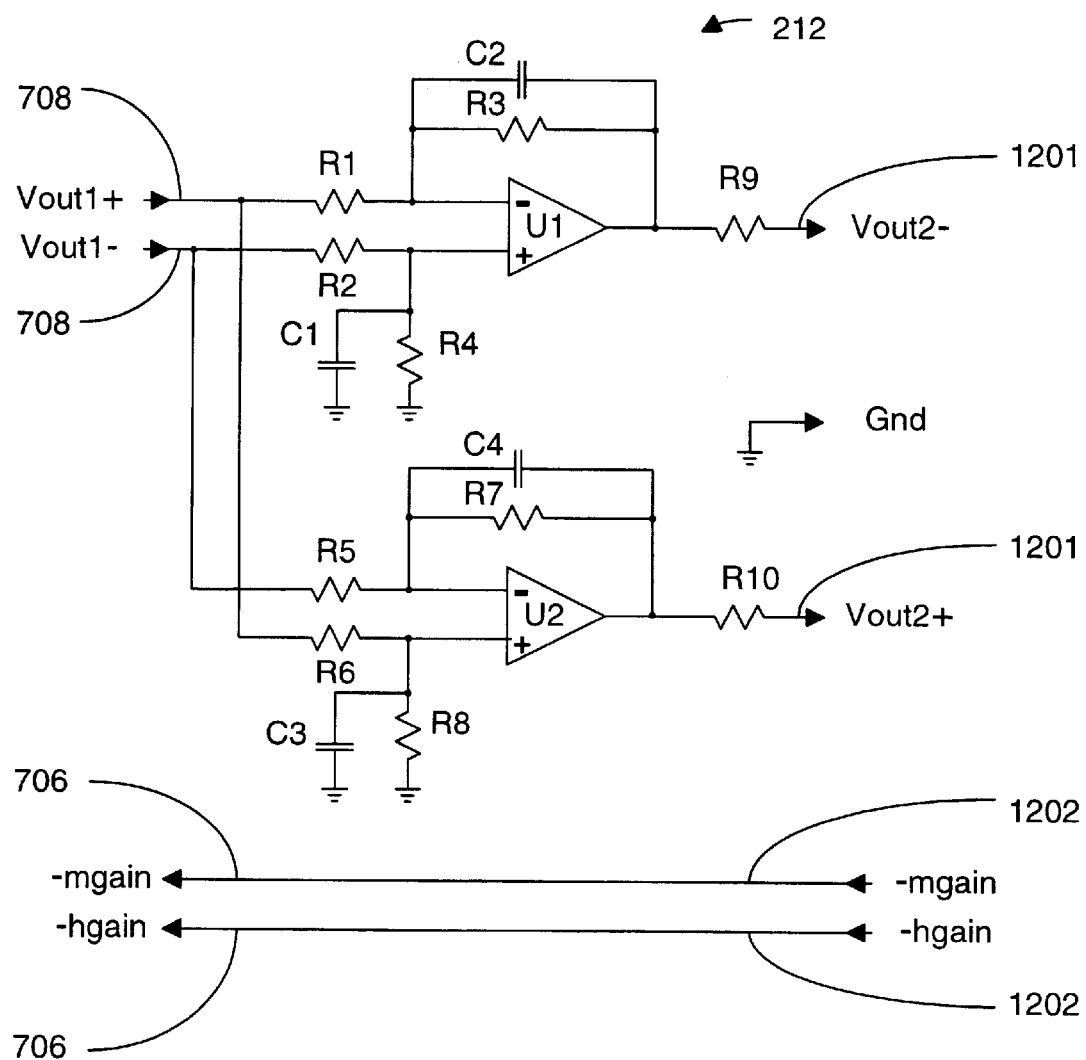
FIG. 12 is a detailed circuit diagram of the sensor assembly transmission interface block of FIG. 2.

Referring now to FIG. 12, there is shown a detailed circuit diagram of the preferred embodiment of the sensor assembly transmission interface 212. Other circuitry could be added to transmit the data and control signals, in some applications, if desired. In this embodiment, field magnitude and polarity information is sent over a differential wire pair, and the gain control signals are received over single ended wire lines. Other control and status signals could be used as well, although this embodiment provides the full functionality of a measurement system.

The pair of differential output signals 708 from demodulator 707 are processed by two identical amplifier stages in a difference amplifier configuration. An LMC6484A integrated circuit, manufactured by National Semiconductor, contains amplifiers U1, U2. The amplifier stage comprising amplifier U1 and its associated components convert the pair of differential signals 708 into a ground referenced inverted signal 1201, while the amplifier stage comprising amplifier U2 and its associated components convert the signals 708 into a ground referenced non-inverted signal 1201. These two signals 1201 form a new ground referenced differential signal pair to be transmitted over data transmission means 102 to data display and sensor control unit 103.

These amplifier stages provide three important functions. They remove common mode noise from the pair of differential signals 708. They also low pass filter the outgoing signal to remove any switching noise from demodulator 707. In the preferred embodiment of the present invention, the low pass filter is set to 10 KHz. Additionally, the differential output signals 1201 are buffered and driven by a low impedance. A pair of resistors R9, R10 are chosen to adjust the output impedance driving the transmission means (a twisted pair of wires in this embodiment) and to provide some isolation to the driving amplifiers U1, U2. The gain and bandwidth of the circuit of FIG. 12 depends on the configuration, gain, and power supplies used for the preceding circuitry. The values of those components used to select gain and bandwidth may be readily determined by persons having ordinary skill in the circuit design art. By transmitting the output signal 1201 as a differential signal pair, the total signal voltage swing can be doubled for the same power supply voltage, and the receiving end can use a difference amplifier to remove the common mode noise that may be picked up during the transmission.

Gain control signals 1202 are the same as control signals 706 that control the gain of the AC differential amplifiers block 704. Low pass filtering and transient voltage protection may be desired in some applications, but is not illustrated in order to simplify the description of the preferred embodiment of the present invention.

Figure 13:
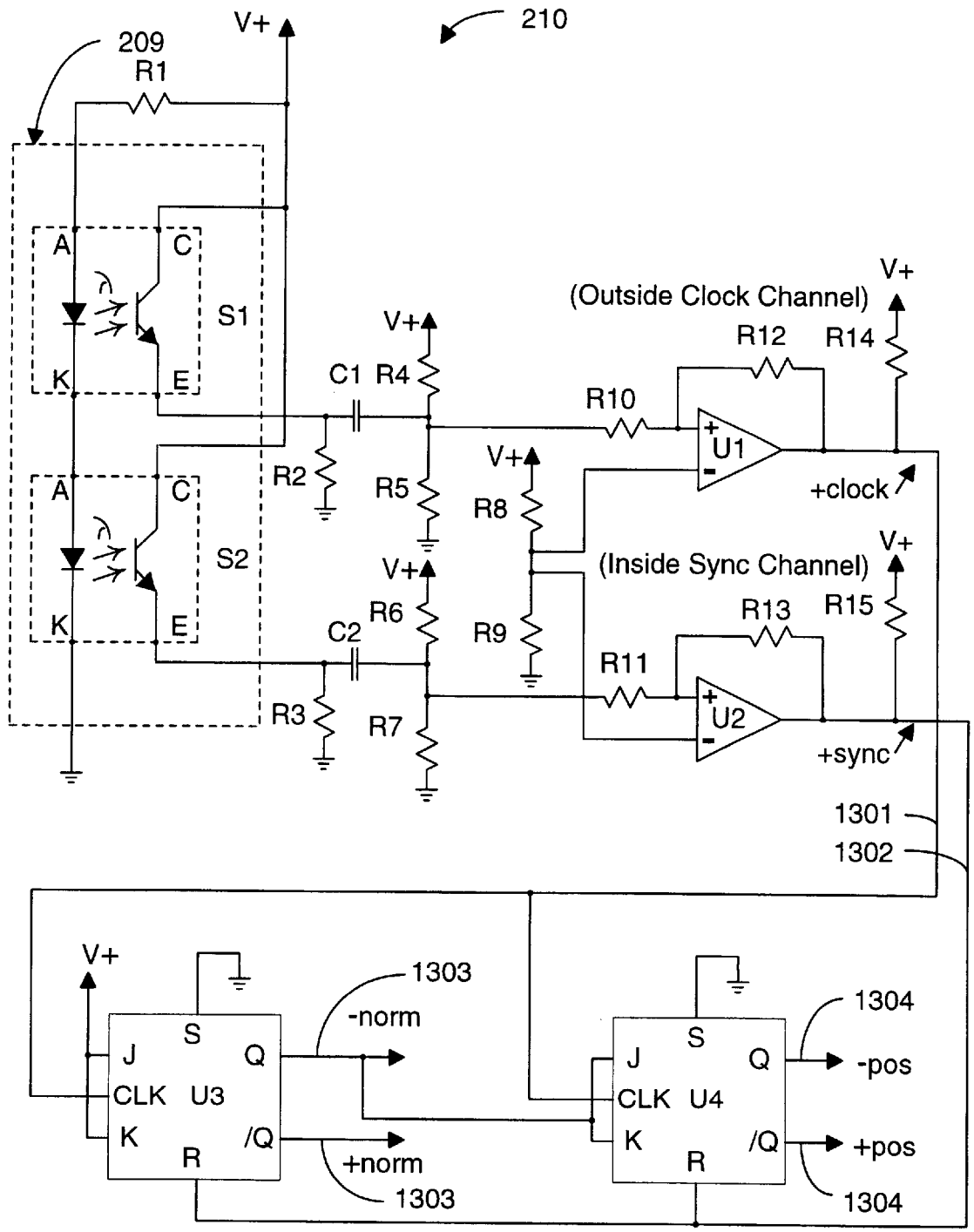
FIG. 13 is a detailed circuit diagram of the timing signal processing block and the encoder sensor block of FIG. 2.

Referring now to FIG. 13, there is shown a detailed circuit diagram of timing signal processing block 210 of FIG. 2 and its connections to encoder sensor 209. Light emitting diodes, within two optical reflective sensors S1 and S2, are powered by supply voltage V+, whose current level is set by resistor R1. Optical sensors suitable for this purpose are the QRB1114 optical sensors manufactured by QT Optoelectronics. The output from optical sensor S1 is hereinafter referred to as the clock signal. The output from optical sensor S2 is hereinafter referred to as the sync signal. Each of the output signals is level shifted by an RC network (R2, C1, R5, R4, and R3, C2, R7, R6) such that the center of swing of the sensor signals is one-half the V+ supply voltage level. The resistor values will be different in the two channels due to the duty cycle difference of the two signals.

A resistive divider that includes resistors R8, R9, serves to set the comparison threshold for comparators U1, U2 at a level equal to one-half of the V+supply voltage level. A TLC374 integrated circuit manufactured by Texas Instruments is suitable for this purpose. A hysterisis is set on comparators U1, U2 by resistor pairs R10, R12 and R11, R13, respectively. Resistors R14, R15 provide the pull-up function for the open drain output stage of comparators U1, U2.

Components U3, U4 are J-K flip-flops, which may comprise an MC14027B integrated circuit manufactured by Motorola, for example. Those persons having ordinary skill in the art will recognize this configuration as a two-bit binary synchronous counter. Since the +pos and −pos timing signals 1304 are at one-half the frequency of the +norm and −norm signals 1303 and all transitions, if occurring, happen at the same time, this configuration provides the ideal timing signals.

This novel method of timing signal generation employs a clock signal 1301 to time all transitions and a sync signal 1302 to align the counter to encoder 204. Other known methods could be employed to encode the norm signals on one radius of encoder 204 and the pos signals on a second radius thereof. This direct encoding method requires accurate alignment of optical sensors S1, S2 and commutation pattern 208. If the transitions are not properly aligned, errors could be introduced by demodulator 707. The above-described method for timing signal generation eliminates these errors.

Figure 14:
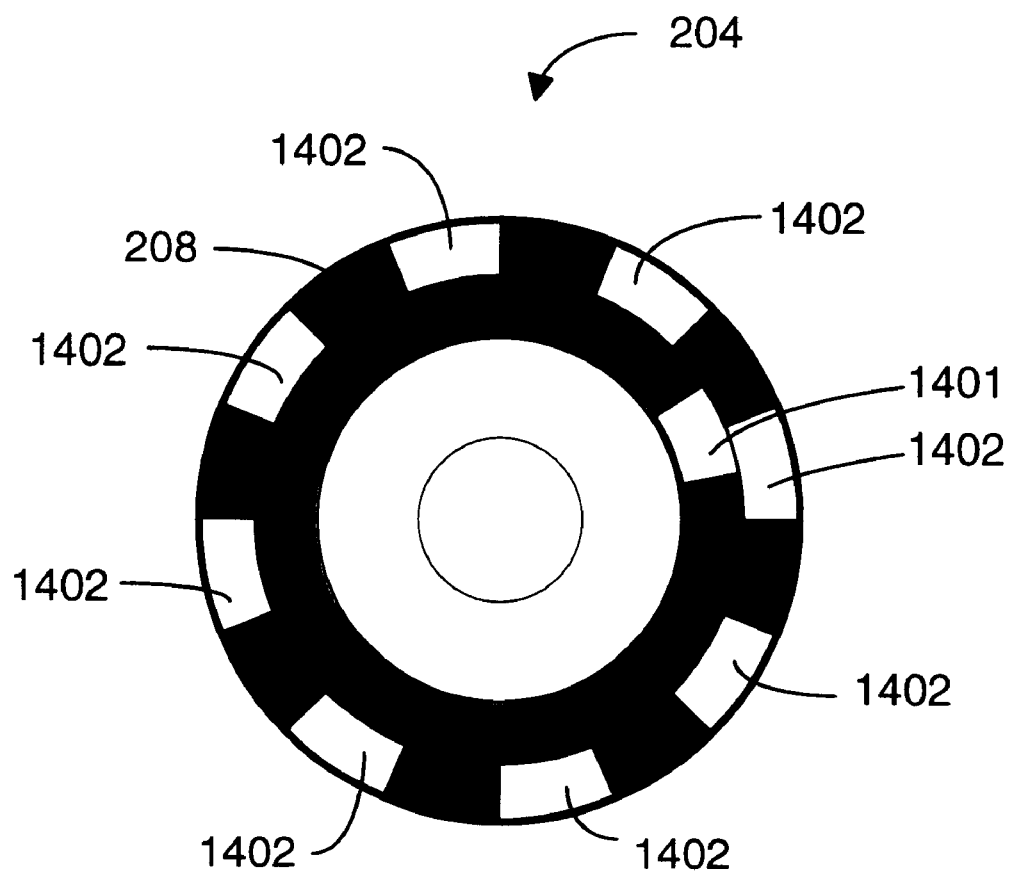
FIG. 14 illustrates the commutation or timing pattern layout of the encoder disk of FIG. 2.

Referring now to FIG. 14, there is shown encoder 204 having a particular commutation pattern 208, in accordance with the preferred embodiment of the present invention. An alternating pattern of reflective and dark areas at the outer radius of encoder 204 serves to generate the clock signal from optical sensor S1. The dark area with one reflective area 1401 at an inner radius of encoder 204 serves to generate the sync signal from optical sensor S2. These signals are used by the timing signal processing block 210 to generate the timing signals used by demodulator 707 to extract the data from the signals received from AC differential amplifiers block 704, thereby generating the pair of differential signals 708 that contains magnitude and polarity information regarding the field being measured at a measurement bandwidth at least 1000 times higher than the prior art.

Encoder 204 and shutter 202 must be aligned on the shaft of motor 205 such that the waveforms of FIG. 11 have the illustrated phase relationship. Small misalignments are allowed in this commutation scheme, although it is most advantageous to optimize the radial alignment of encoder 204 and shutter 202 to achieve the presented phase relationship.

Figure 15:
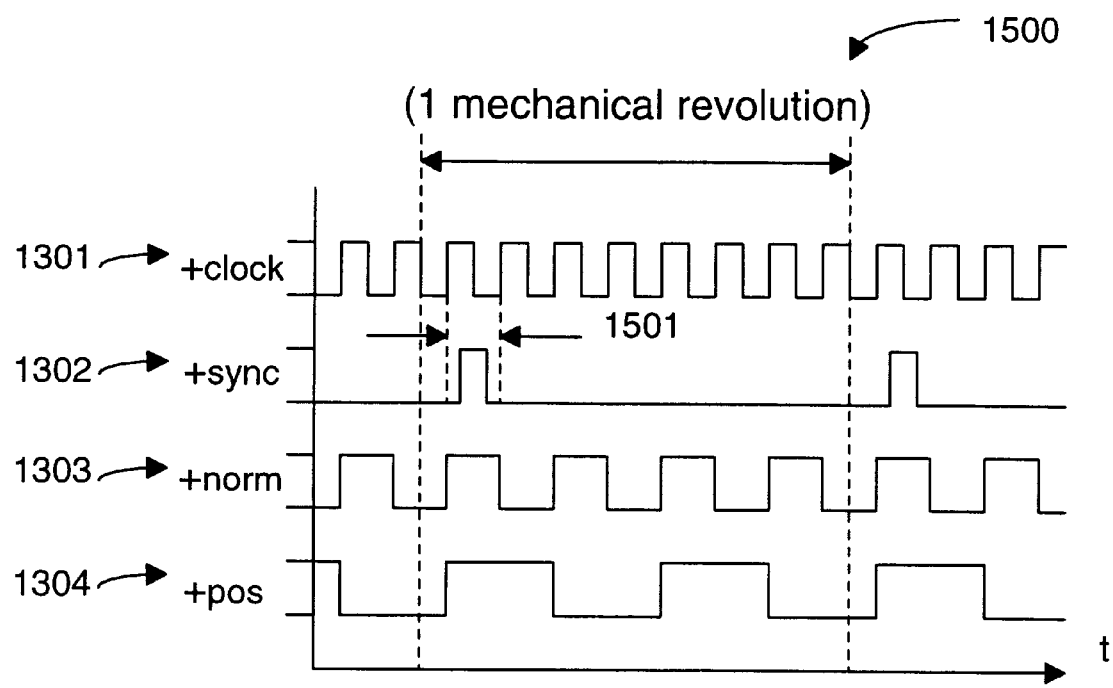
FIG. 15 is a waveform diagram illustrating waveforms relating to the encoder, encoder sensor, and timing signal processing blocks of FIG. 2.

Referring now to FIG. 15, there is shown the signal waveforms related to the counter circuit within timing signal processing block 210. These waveforms are shown on a common time axis 1500 with the time required for one mechanical revolution of encoder 204 and shutter 202 illustrated by two vertical dashed lines. The +clock signal 1301 originates from the pattern 1402 at the outer radius of encoder 204. The outer radius was chosen for this higher frequency signal in order that the feature size and spacing of the pattern be as large as possible compared to the reflective optical sensor measurement spot diameter. Since the +clock signal 1301 determines the final timing of demodulator 707, this choice is advantageous. The frequency of the +clock signal 1301 is twice that of the +norm signal 1303 and four times that of +pos signal 1304.

The +sync signal 1302 originates from the pattern at the inner radius 1401 of encoder 204. This signal synchronizes the counter to a particular phase relationship with respect to rotating encoder 204 and shutter 202 and serves to reset the counter to a particular state. As rotation of encoder 204 and shutter 202 continues, the +sync signal has no effect unless the counter is disturbed by transient electrical noise. If the counter is out of synchronization, the +sync signal will realign the counter within one revolution of encoder 204 and shutter 202. The timing accuracy and pulse width of the +sync signal are not critical in the present timing signal generation method. The high state of the pulse can occur at any time within the time range 1501. The pulse width can be as wide as that range as long as it does not occur at the same time as the positive transitions of the +clock signal. At a minimum, the pulse width must be long enough to reset the counter. The optimum width is one-half of the difference between these minimum and maximum pulse widths, as illustrated by waveform 1302.

Figure 16:
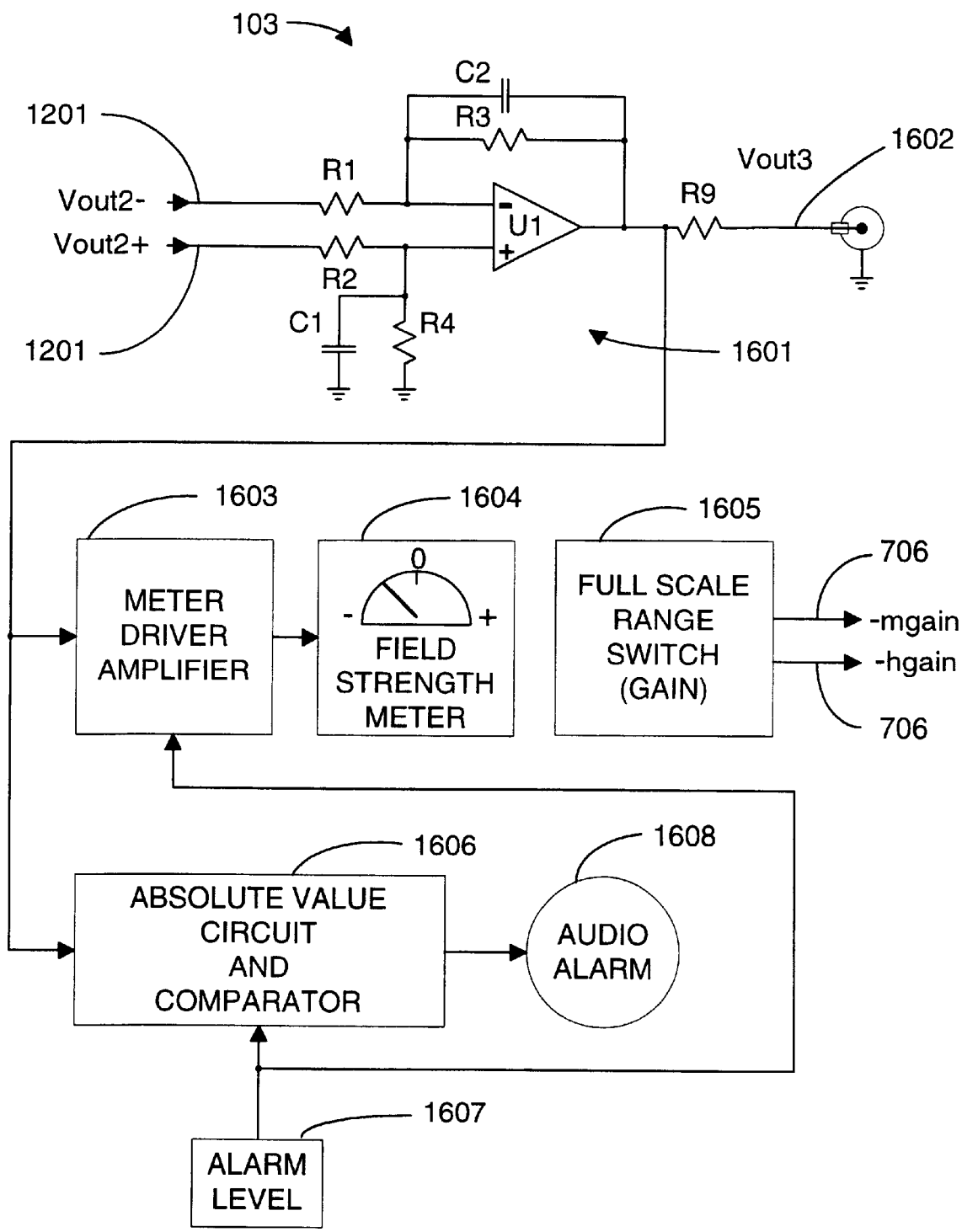
FIG. 16 is a more detailed circuit and block diagram of the data display and sensor control unit block of FIG. 1.

Referring now to FIG. 16, there are shown details of data display and sensor control unit 103 in accordance with the preferred embodiment of the present invention. The circuity of FIG. 16 represents a minimal set of possible circuits and functions that are required. The pair of input differential signals 1201 is received from the data transmission means 102, originating in field sensor assembly 101. The difference amplifier configuration 1601 comprising amplifier U1 and its associated components remove the common mode noise that could be picked up during the data transmission and provides a high input impedance such that transmission means 102 and sensor assembly transmission interface 212 are not loaded, in order to preserve measurement accuracy. The gain and bandwidth of this stage depends on the other circuits in the system, the data transmission method, and the supply voltage levels. The bandwidth should be at least as high as the desired signal bandwidth of 10 KHz. Those persons having ordinary skill in the art can readily select appropriate component values for this familiar amplifier configuration. The LMC6484A integrated circuit manufactured by National Instruments is suitable for comparator U1.

A Vout3 output signal 1602 is provided as an external signal for use by a computer, a data acquisition system or some other processing or monitoring equipment. The signal from amplifier U1 is also amplified by a meter driver amplifier 1603 and used to indicate the field magnitude and polarity on field strength meter 1604. The signal from amplifier U1 also is processed by an absolute value circuit and comparator 1606 that compares the magnitude of the field signal to a user set level from an alarm level block 1607. When the field level exceeds the alarm level, an audible alarm is initiated by an audio alarm 1608. This is useful when the sensor of the present invention is employed to detect dangerous field levels that could precede lightning strikes in approaching thunderstorms. The alarm level is also provided as a user selectable input into a meter driver amplifier 1603 in order to permit accurate adjustment of the alarm level by alternatively displaying it on the same meter on which the field magnitude and polarity are displayed.

A full scale range switch 1605 generates the gain control signals 706 that are transmitted over data transmission means 102 to field sensor assembly 101 to control the gain of the AC differential amplifiers block 704. The full-scale ranges chosen in the preferred embodiment of the present invention are 1 KV/m, 3KV/m and 10KV/m. Other levels may be set by the resistor values in the AC differential amplifiers block 704.

Figure 17:
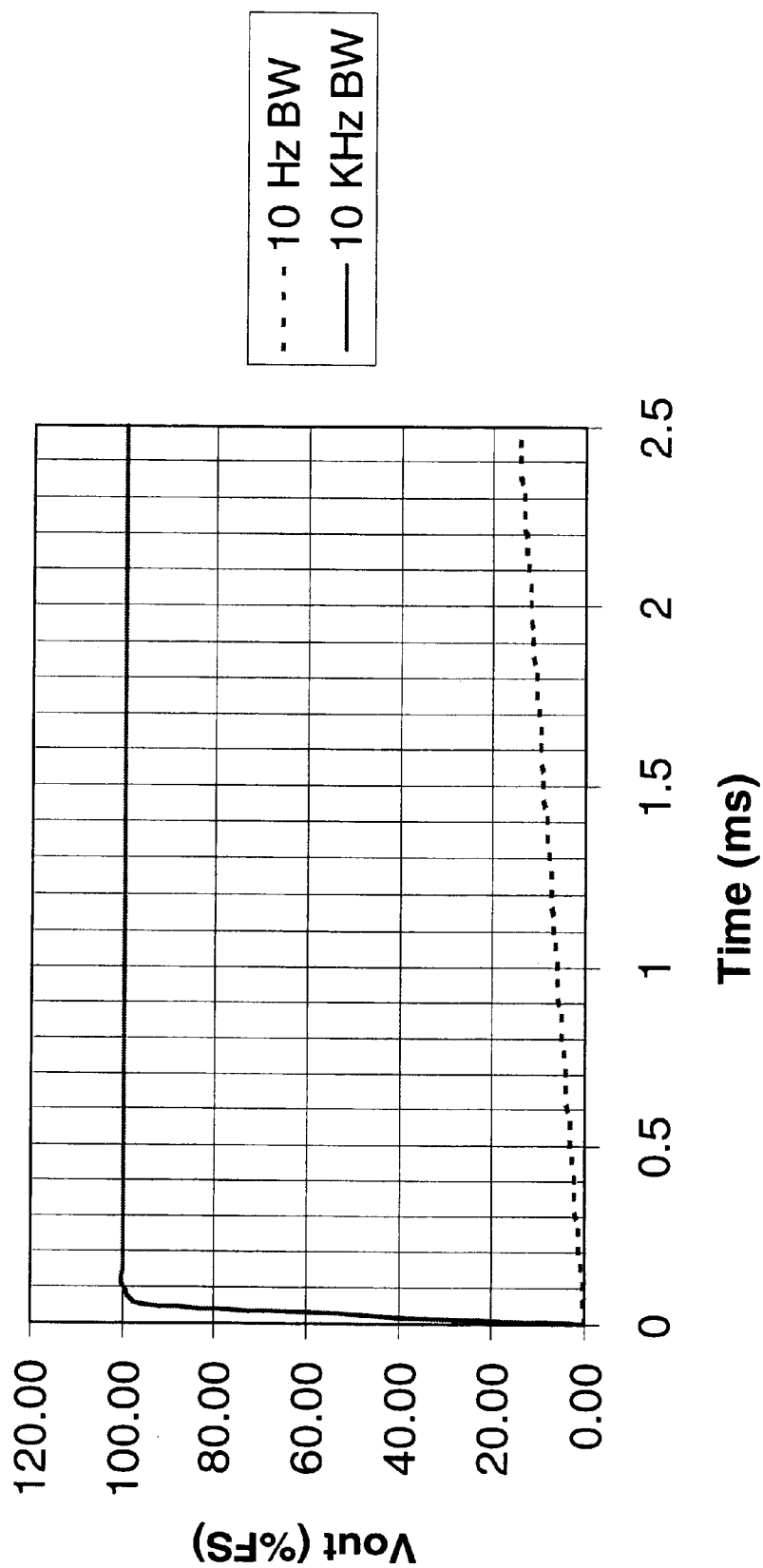
FIG. 17 are graphs of output voltage versus time produced by a typical prior art field mill and by the sensor of the present invention in response to a rapid change of the field being measured.

Referring now to FIG. 17, there is shown the theoretical waveforms of field level signal 1602 obtained in accordance with the present invention and of a similar measurement signal obtained from a prior art field mill, illustrating the difference resulting from the 10 KHz bandwidth of the present invention and the 10 Hz bandwidth of the prior art apparatus. The waveform diagram compares the two signals on the same time axis. If the field being measured changes rapidly, such as following a lightning strike, the bandwidth of the measuring device limits the time response of the measured levels. In this chart the change is from 0% to 100%. The field level measured by the sensor of the present invention having an arbitrarily set bandwidth of 10 KHz is shown by the solid line and is accurate within 100 us or less of the field change time. The dotted line shows the same field change applied to a prior art system having a typical bandwidth of 10 Hz. It can be seen that the output has not yet increased to 15% of its final value during the 2.5 ms time period on this diagram. The prior art field mill would require about 80 ms to settle to the final value, whereas the present invention takes about 80 us. This shows the major advantage of the higher bandwidth achievable with the present invention over the prior art. This response also allows this invention to replace the combination of a field mill, a slow antenna, and a fast antenna represented by the prior art. Bandwidths wider than 10 KHz and associated faster time responses can be achieved with the present invention, depending on component choices and sensor structure.

Another advantage of the quadrature differential sensor configuration of the present invention is suppression of unwanted field magnitude errors due to transient field characteristics. Basically, the sensor current is $I(t)=dQ/dt$, where $dQ/dt$ is the change of charge on the sensor 203 with respect to time. This current can be broken down by differentiating the charge equation $Q(t)=e0*E(t)*A(t)$ where $e0$ is the permittivity of free space and is a constant, $E(t)$ is the electrostatic field 201, and $A(t)$ is the area of the sensor 203. Since both the field 201 and the area of sensor 203 are changing as a function of time, the current $I(t)$ is proportional to $E*dA/dt+A*dE/dt$. The first term ($E*dA/dt$) is the desired measurement for any instantaneous value of the field 201. The second term $A*dE/dt$ is an error term at any instantaneous value of the area of sensor 203. It is desirable to remove the effects of this second term such that the accuracy of the field measurement (first term) is preserved. This second term (error) originates from the rate of change of the field 201 introducing charge on the present area of the sensor 203 that is exposed to the field 201. In the prior art, the sensor areas are sometimes totally exposed to the field to be measured, so this term, at that time, is completely included in the measurement signal. The low pass filtering of the prior art smoothes the error spike into a lower, longer-term error signal lasting many time constants of the low pass filter.

Figure 18:
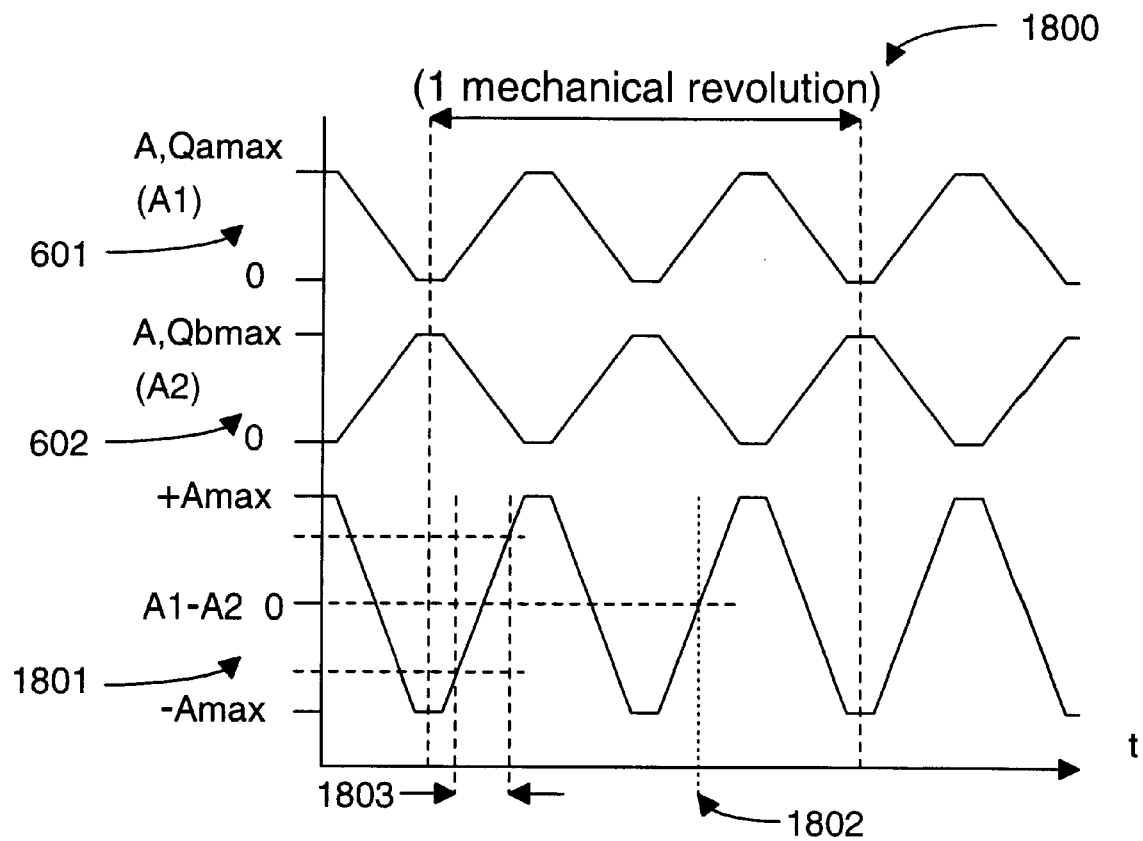
FIG. 18 is a waveform diagram illustrating the capability of the field sensor assembly of the present invention to suppress undesired errors relating to field level transients.

In the present invention, the differential quadrature sensor configuration has the advantage that the total error is never introduced and therefore a wider bandwidth system can be achieved with less error. FIG. 18 illustrates this error suppression by waveforms on a common time axis 1800 with the time of one mechanical revolution of the shutter 202 shown by the two vertical dotted lines. Waveforms 601 and 602 have previously described. They represent the differential charge signals, or the exposed areas "A" and "B" of sensor 203. The signals from the quadrature signal path have the same characteristic so are not presented here to minimize repetition.

The differential nature of the signal processing generates a signal proportional to the difference in areas A1, A2 of waveforms 601, 602. Expanding this difference into components, as was done above, shows that the differential signal is proportional to $2*E(t)*dA/dt+[A1(t)-A2(t)]*dE/dt$. The first term $(2*E(t)*dA/dt)$ shows that the desired measurement value is doubled over the single ended case described above. The second term $([A1(t)-A2(t)]*dE/dt)$ is the error and is proportional to the term $[A1(t)-A2(t)]$ which is the difference between the "A" and "B" areas of sensor 203. That value is shown by waveform 1801. It can be seen at the time point 1802 of FIG. 18 that the value is equal to zero; therefore, there is no error caused by the dE/dt or field transient. As explained above, only the center part of the linear slopes of these waveforms is used in the present invention. This center range, of one slope segment, is shown by the time range 1803 in FIG. 18. It can be seen that the corresponding value on the y-axis value is typically 50% to 60% of the single sensor pair area "A", depending on the shape of the actual waveform. This means that the total error value ranges from zero to 0.5 times the area. As previously stated, the desired signal is doubled or two times the single sensor area. If the signal-to-noise ratio is calculated for the range of error values (2/0=infinity and 2/0.5=4), it can be seen that the signal to noise has a minimum increase of 4 over a single-ended non-quadrature prior art system. In other words, the present invention suppresses this error a minimum of 4 times (complete suppression as a maximum) over the referenced prior art. The level of suppression depends on the time at which the field transient occurs compared to the shutter rotation position. This provides more accurate field measurements and allows for wider bandwidths since the low pass filter is not required to smooth this error.

In summary, the present invention results in more accurate measurement of electrostatic fields by providing wider bandwidth, suppression of errors due to field transients, suppression of noise at the sensor and signal processing stages, and suppression of noise during the transmission of data to the data display and sensor control unit 103, all of which features distinguish the present invention over the prior art.

I claim:

1. An electrostatic field sensor comprising:
    a first set of one or more conducting sensor segments electrically connected together;
    a second set of one or more conducting sensor segments electrically connected together;
    a third set of one or more conducting sensor segments electrically connected together;
    a fourth set of one or more conducting sensor segments electrically connected together;
    a non-conducting member for supporting and electrically insulating said first, second, third, and fourth sets of conducting sensor segments from each other and from a surrounding structure;
    means for alternately exposing and shielding said first, second, third, and fourth sets of conducting sensor segments to and from an electrostatic field to be measured that is substantially perpendicular to a surface containing said first, second, third, and fourth sets of conducting sensor segments, said means for alternately exposing and shielding said first, second, third, and fourth sets of conducting sensor segments being operative for producing a first sensor signal from said first set of one or more sensor segments and for producing a second sensor signal from said second set of one or more sensor segments, said first and second sensor signals being alternating signals that are substantially 180 electrical degrees out of phase and that represent a first differential pair signal, said means for alternately exposing and shielding said first, second, third, and fourth sets of conducting sensor segments being operative for producing a third sensor signal from said third set of one or more sensor segments and for producing a fourth sensor signal from said fourth set of one or more sensor segments, said third and fourth sensor signals being alternating signals that are substantially 180 electrical degrees out of phase and that represent a second differential pair signal, said first and second differential pair signals being substantially 90 electrical degrees out of phase.

2. An electrostatic field sensor as in claim 1, wherein:
    each of said first, second, third, and fourth sets of conducting sensor segments comprises two conducting sensor segments; and
    said means for alternately exposing and shielding said first, second, third, and fourth sets of conducting sensor segments from an electrostatic field to be measured comprises a grounded shield element that is alternately placed between selected ones of said first, second, third, and fourth conducting sensor segments and said electrostatic field and removed therefrom.

3. An electrostatic field sensor as in claim 2, further comprising:
    a non-conducting disk-shaped support member having a surface on which said first, second, third, and fourth sets of conducting sensor segments are contained, said first set of conducting sensor segments being positioned toward an outer radius of said disk-shaped support member, each of the two segments thereof covering a substantially 90-degree arc and being displaced from each other by substantially 180 circumferential degrees, said second set of conducting sensor segments also being positioned toward an outer radius of said disk-shaped support member, each of the two segments thereof covering a substantially 90-degree arc between the two segments of said first set of conducting sensor segments, said third set of conducting sensor segments being positioned toward an inner radius of said disk-shaped support member, each of the two segments thereof covering a substantially 90-degree arc and being displaced from each other by substantially 180 circumferential degrees and being displaced from each of the two segments of said first set of conducting sensor segments by substantially 45 circumferential degrees, said fourth set of conducting sensor segments also being positioned toward an inner radius of said disk-shaped support member, each of the two segments thereof covering a substantially 90-degree arc between the two segments of said third set of conducting sensor segments; and wherein:
    said grounded shield element comprises a disk having an outer radius that is at least as great as an outermost radius of said first and second sets of conducting sensor segments, said grounded shield element being positioned between said first, second, third, and fourth sets of conducting sensor segments and said electrostatic field to be measured, said grounded shield element having two openings therein covering a substantially 90-degree arc and displaced from each other by substantially 180 circumferential degrees, a radius of each of said two openings extending between an innermost radius of said third and fourth sets of conducting sensor segments and said outermost radius of said first and second sets of conducting sensor segments.

4. An electrostatic field sensor as in claim 1, wherein:

each of said first, second, third, and fourth sets of conducting sensor segments comprises one conducting sensor segment; and said means for alternately exposing and shielding said first, second, third, and fourth sets of conducting sensor segments to and from an electrostatic field to be measured comprises an electronic shield.

5. An electrostatic field sensor as in claim 1, wherein:

each of said first, second, third, and fourth sets of conducting sensor segments comprises one conducting sensor segment; and said means for alternately exposing and shielding said first, second, third, and fourth sets of conducting sensor segments to and from an electrostatic field to be measure comprises a grounded shield element.

6. An electrostatic field sensor as in claim 1, wherein:

each of said first, second, third, and fourth sets of conducting sensor segments comprises one conducting sensor segment; and each conducting sensor segment comprises a multiplicity of areas;

said electrostatic field sensor further comprising means for selectively connecting said multiplicity of areas to vary an area exposed to the electrostatic field to be measured.

7. A wide bandwidth apparatus for measuring electrostatic fields, comprising:

a first set of one or more conducting sensor segments electrically connected together;

a second set of one or more conducting sensor segments electrically connected together;

a third set of one or more conducting sensor segments electrically connected together;

a fourth set of one or more conducting sensor segments electrically connected together;

a non-conducting member for supporting and electrically insulating said first, second, third, and fourth sets of conducting sensor segments from each other and from a surrounding structure;

means for alternately exposing and shielding said first, second, third, and fourth sets of conducting sensor segments to and from an electrostatic field to be measured that is substantially perpendicular to a surface containing said first, second, third, and fourth sets of conducting sensor segments, said means for alternately exposing and shielding said first, second, third, and fourth sets of conducting sensor segments being operative for producing a first sensor signal from said first set of one or more sensor segments and for producing a second sensor signal from said second set of one or more sensor segments, said first and second sensor signals being alternating signals that are substantially 180 electrical degrees out of phase and that represent a first differential pair signal, said means for alternately exposing and shielding said first, second, third, and fourth sets of conducting sensor segments being operative for producing a third sensor signal from said third set of one or more sensor segments and for producing a fourth sensor signal from said fourth set of one or more sensor segments, said third and fourth sensor signals being alternating signals that are substantially 180 electrical degrees out of phase and that represent a second differential pair signal;

four transimpedance amplifiers for receiving said first, second, third, and fourth sensor signals and for producing four voltage signals proportional to said first, second, third, and fourth sensor signals, respectively;

two AC differential amplifiers connected to said four transimpedance amplifiers for receiving pairs of said four voltage signals and for differentially amplifying an AC component of each of said pairs of said four voltage signals for producing first and second differential pair signals;

a demodulator connected to said AC differential amplifiers for receiving said first and second differential pair signals therefrom;

an encoder disk containing a predetermined timing pattern;

a grounded shield for alternately shielding and exposing said first, second, third, and fourth sets of sensor segments from said electrostatic field to be measured;

a motor for rotating said encoder disk and said grounded shield in concert;

an encoder sensor for reading the timing pattern of said encoder disk during rotation thereof and for providing one or more timing signals;

a timing signal processor connected to said encoder sensor for receiving and conditioning said one or more timing signals to provide one or more conditioned timing signals;

said demodulator being operative for generating a differential output signal comprising a selected one of an inverted and non-inverted one of said first and second differential pair signals, the selection being a function of said conditioned timing signals; and a sensor assembly transmission interface connected to receive said differential output signal from said demodulator.

8. An apparatus as in claim 7, wherein said AC differential amplifiers further comprise a selectively-controlled gain function.

9. An apparatus as in claim 7, wherein:

said encoder disk is reflective and said timing pattern is non-reflective; and said encoder sensor comprises an optical reflective sensor.

10. An apparatus as in claim 7, wherein said timing signal processor comprises a two-bit binary counter having a clock input connected to one of said timing signals, having a counter reset input connected to another of said timing signals, and having an output connected to said demodulator.

11. An apparatus as in claim 7, wherein said first and second differential pair signals comprise two differential AC signals out of phase by substantially 90 electrical degrees.

12. An apparatus as in claim 7, wherein said sensor assembly transmission interface is operative for generating a buffered, ground-referenced differential output signal from said differential output signal received from said demodulator.

13. An apparatus as in claim 7, wherein said sensor assembly transmission interface is operative for generating an optical signal from said differential output signal received from said demodulator.

14. An electrostatic field sensor comprising:

an even number of four or more sets of conducting sensor segments, each set comprising one or more electrically connected sensor segments;

a non-conducting member for supporting and electrically insulating said sets of conducting sensor segments from each other and from a surrounding structure;

means for alternately exposing and shielding said sets of conducting sensor segments to and from an electrostatic field to be measured that is substantially perpendicular to a surface containing said sets of conducting sensor segments, said means for alternately exposing and shielding said sets of conducting sensor segments being operative for producing a sensor signal from each of one of said sets of conducting sensor segments, the sensor signals so produced being grouped in pairs of first and second sensor signals, said first and second sensor signals being alternating signals that are substantially 180 electrical degrees out of phase and that represent a differential pair signal, each said differential pair signal being out of phase with each other differential pair signal, the phase difference between adjacent differential pair signals being substantially equal to the quotient obtained by dividing 360 by said number of sets of conducting sensor segments.

* * * * *